United States Patent
Lin et al.

(10) Patent No.: US 11,935,793 B2
(45) Date of Patent: Mar. 19, 2024

(54) DUAL DOPANT SOURCE/DRAIN REGIONS AND METHODS OF FORMING SAME

(71) Applicant: Taiwan Semiconductor Manufacturing Co., Ltd., Hsinchu (TW)

(72) Inventors: Yu-Chang Lin, Hsinchu (TW); Tien-Shun Chang, New Taipei (TW); Chun-Feng Nieh, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 6 days.

(21) Appl. No.: 16/887,154

(22) Filed: May 29, 2020

(65) Prior Publication Data
US 2021/0375687 A1 Dec. 2, 2021

(51) Int. Cl.
*H01L 21/8234* (2006.01)
*H01L 21/223* (2006.01)
(Continued)

(52) U.S. Cl.
CPC .. *H01L 21/823431* (2013.01); *H01L 21/2236* (2013.01); *H01L 21/265* (2013.01); *H01L 21/26506* (2013.01); *H01L 21/26513* (2013.01); *H01L 21/2658* (2013.01); *H01L 21/823418* (2013.01); *H01L 21/823814* (2013.01); *H01L 21/823821* (2013.01); *H01L 27/0924* (2013.01);
(Continued)

(58) Field of Classification Search
CPC ..... H01L 21/823431; H01L 21/823418; H01L 21/265; H01L 29/66795; H01L 29/785; H01L 27/0886; H01L 27/0924; H01L 21/823821; H01L 21/823814; H01L 29/7848; H01L 21/823425; H01L 21/2236; H01L 21/26506; H01L 21/2658; H01L 21/26586; H01L 27/0928
See application file for complete search history.

(56) References Cited

U.S. PATENT DOCUMENTS 8,962,400 B2   2/2015   Tsai et al.
9,093,514 B2   7/2015   Tsai et al.
(Continued)

FOREIGN PATENT DOCUMENTS

KR   20200036733 A   4/2020
TW     201712763 A   4/2017
(Continued)

OTHER PUBLICATIONS

Bai et al. "Confining P diffusion in Si by an As-doped barrier layer," American Institute of Physics, Applied Physics Letters 91, 2007, 3 pages.

*Primary Examiner* — Mary A Wilczewski
(74) *Attorney, Agent, or Firm* — Slater Matsil, LLP

(57) ABSTRACT

A method includes forming a source/drain region in a semiconductor fin; after forming the source/drain region, implanting first impurities into the source/drain region; and after implanting the first impurities, implanting second impurities into the source/drain region. The first impurities have a lower formation enthalpy than the second impurities. The method further includes after implanting the second impurities, annealing the source/drain region.

18 Claims, 29 Drawing Sheets

(51) Int. Cl.
*H01L 21/265* (2006.01)
*H01L 21/336* (2006.01)
*H01L 21/8238* (2006.01)
*H01L 27/092* (2006.01)
*H01L 29/66* (2006.01)
*H01L 29/78* (2006.01)

(52) U.S. Cl.
CPC ...... *H01L 29/66795* (2013.01); *H01L 29/785* (2013.01); *H01L 21/26586* (2013.01); *H01L 21/823425* (2013.01)

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 10,056,383 B2* | 8/2018 | Lin | H01L 21/823418 |
| 10,109,488 B2* | 10/2018 | Byl | H01J 37/3171 |
| 10,304,957 B2* | 5/2019 | Roh | H01L 29/785 |
| 10,515,966 B2* | 12/2019 | Lin | H01L 21/26513 |
| 10,658,510 B2* | 5/2020 | Liu | H01L 21/823431 |
| 10,916,546 B2* | 2/2021 | Lin | H01L 21/26513 |
| 11,195,951 B2* | 12/2021 | Yu | H01L 29/7851 |
| 11,257,952 B2* | 2/2022 | Liu | H01L 29/167 |
| 11,404,561 B2* | 8/2022 | More | H01L 29/41791 |
| 11,616,142 B2* | 3/2023 | Yu | H01L 29/0847 257/190 |
| 2008/0023752 A1* | 1/2008 | Chen | H01L 29/66636 257/E29.054 |
| 2008/0293204 A1* | 11/2008 | Nieh | H01L 21/26586 438/291 |
| 2011/0287600 A1* | 11/2011 | Cheng | H01L 21/823425 438/299 |
| 2012/0088342 A1* | 4/2012 | Ming | H01L 21/823814 257/E21.409 |
| 2013/0020612 A1* | 1/2013 | Wann | H01L 29/7848 257/190 |
| 2013/0126949 A1* | 5/2013 | Liao | H01L 29/045 257/288 |
| 2014/0084369 A1* | 3/2014 | Murthy | H01L 21/02381 257/344 |
| 2015/0206945 A1* | 7/2015 | Chen | H01L 23/485 438/300 |
| 2015/0372142 A1* | 12/2015 | Kuang | H01L 29/7848 257/192 |
| 2016/0190251 A1* | 6/2016 | Feng | H01L 29/161 257/288 |
| 2017/0084741 A1* | 3/2017 | Lin | H01L 29/7855 |
| 2017/0250084 A1* | 8/2017 | Byl | H01J 37/3171 |
| 2018/0076326 A1* | 3/2018 | Roh | H01L 29/165 |
| 2018/0108654 A1 | 4/2018 | Ontalus et al. | |
| 2018/0337234 A1 | 11/2018 | Zhao | |
| 2019/0006363 A1 | 1/2019 | Lin et al. | |
| 2019/0019796 A1* | 1/2019 | Liu | H01L 27/1104 |
| 2019/0103275 A1* | 4/2019 | Byl | H01J 37/244 |
| 2019/0123201 A1* | 4/2019 | Li | H01L 29/66636 |
| 2019/0148492 A1* | 5/2019 | Yong | H01L 29/7848 257/401 |
| 2020/0006545 A1* | 1/2020 | Liu | H01L 29/66545 |
| 2020/0013878 A1 | 1/2020 | Colombeau et al. | |
| 2020/0075578 A1 | 3/2020 | Li | |
| 2020/0105934 A1 | 4/2020 | Ma et al. | |
| 2020/0168735 A1* | 5/2020 | Yu | H01L 21/823431 |
| 2020/0279944 A1* | 9/2020 | Liu | H01L 21/02694 |
| 2021/0358908 A1* | 11/2021 | Ehlert | H01L 27/0886 |
| 2021/0375687 A1* | 12/2021 | Lin | H01L 29/66795 |
| 2022/0037507 A1* | 2/2022 | More | H01L 29/785 |
| 2022/0093800 A1* | 3/2022 | Yu | H01L 29/0847 |
| 2022/0367673 A1* | 11/2022 | More | H01L 29/6681 |
| 2023/0231053 A1* | 7/2023 | Yu | H01L 29/66795 257/190 |
| 2023/0238381 A1* | 7/2023 | Liu | H01L 21/845 257/369 |

FOREIGN PATENT DOCUMENTS

| | | |
|---|---|---|
| TW | 201824541 A | 7/2018 |
| TW | 202002012 A | 1/2020 |

* cited by examiner

DUAL DOPANT SOURCE/DRAIN REGIONS AND METHODS OF FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
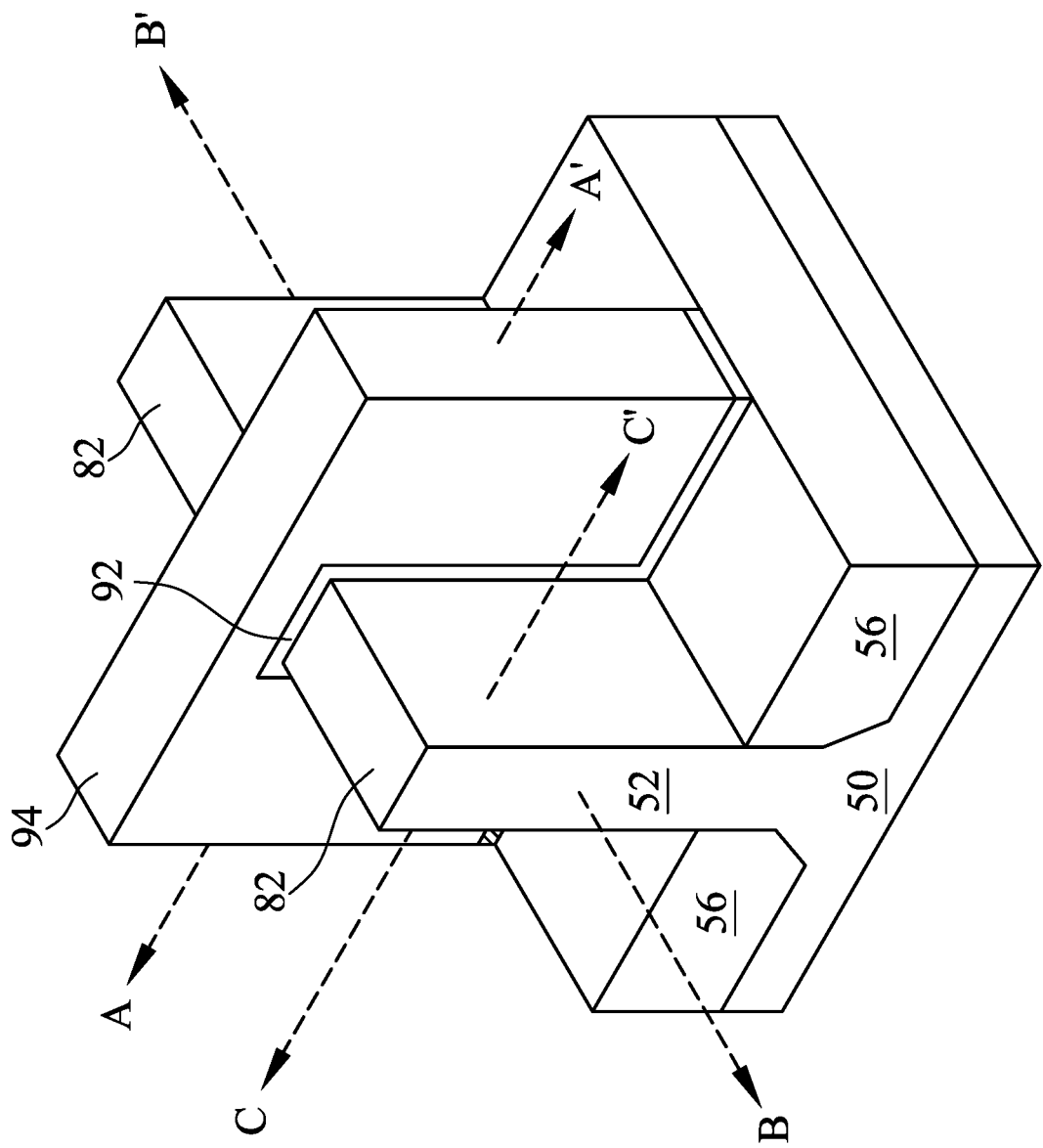
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include implanting two different types of dopants into a source/drain region for improved junction abruptness (e.g., reduced leakage current) and reduced source/drain contact resistance. In an embodiment method, first dopants are implanted into a source/drain region followed by an implantation of second dopants. The first dopants are a different element than the second dopants, and the first dopants may have a lower formation enthalpy than the second dopants. For example, the first dopants may comprise arsenic, carbon, antimony, or the like, and the second dopants may comprise phosphorous, or the like. In particular embodiments, the arsenic is implanted into the source/drain regions followed by a phosphorous dimer ($P_2$) implantation. As a result of its lower formation enthalpy, the first dopants are more attracted to and form more stable bonds with vacancies in the source/drain region. For example, the first dopants may be used to reduce diffusion of the second dopants and reduce the binding of the second dopants with the vacancies. By reducing diffusion of the second dopant, a higher concentration of the second dopant may be achieved in a contact area of the source/drain region, thereby reducing source/drain contact resistance. Further, the use of two different elements as dopants allows for a junction with improved abruptness and less diffusion, thereby providing improved short channel control (e.g., to counter the effects of drain-induced barrier lowering (DIBL) in advanced process nodes). Various embodiments may provide one or more of the following non-limiting advantages: improved junction abruptness, reduced diffusion of the second dopants, and reduced source/drain contact resistance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 23B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 18A, 19A, 20A, 21A, 22A, and 23A are illustrated along reference cross-section A-A illustrated in FIG. 1, and FIGS. 8B, 9B, 10, 12A, 13A, 14A, 15A, 16, 17, 18B, 19B, 20B, 21B, 22B, and 23B are illustrated along a similar cross-section B-B illustrated in FIG. 1, except for multiple fins/FinFETs. FIGS. 12B, 12C, 15B, and 15C are illustrated along reference cross-section C-C illustrated in FIG. 1, except for multiple fins/FinFETs.

Figure 2:
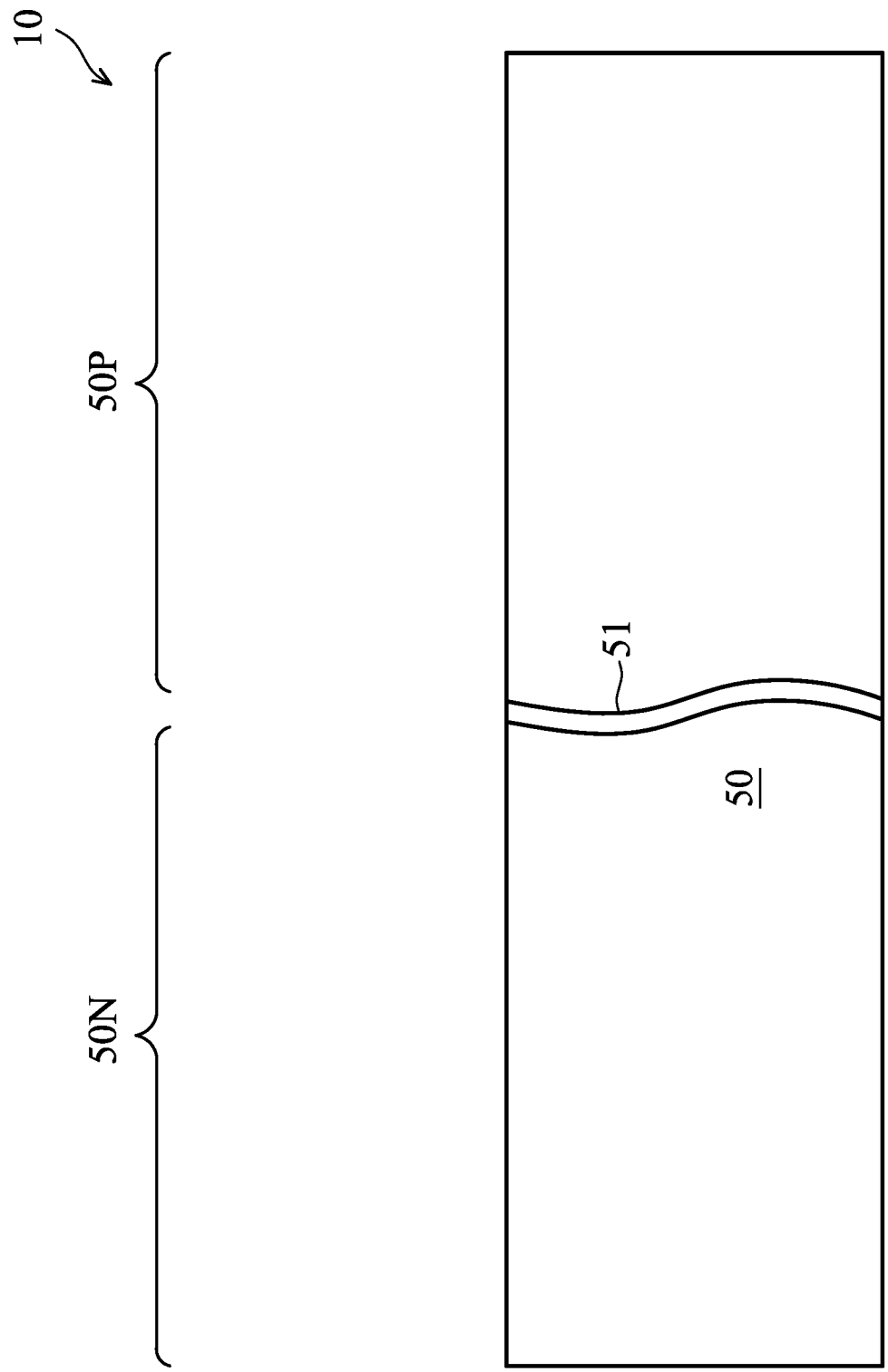
FIGS. 2, 3, 4, 5, 6, 7, 8A, 8B, 9A, 9B, 10, 11, 12A, 12B, 12C, 13A, 13B, 14A, 14B, 15A, 15B, 15C, 16, 17, 18A, 18B, 19A, 19B, 20A, 20B, 21A, 21B, 21C, 22A, 22B, 23A, and 23B are cross-sectional and top-down views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
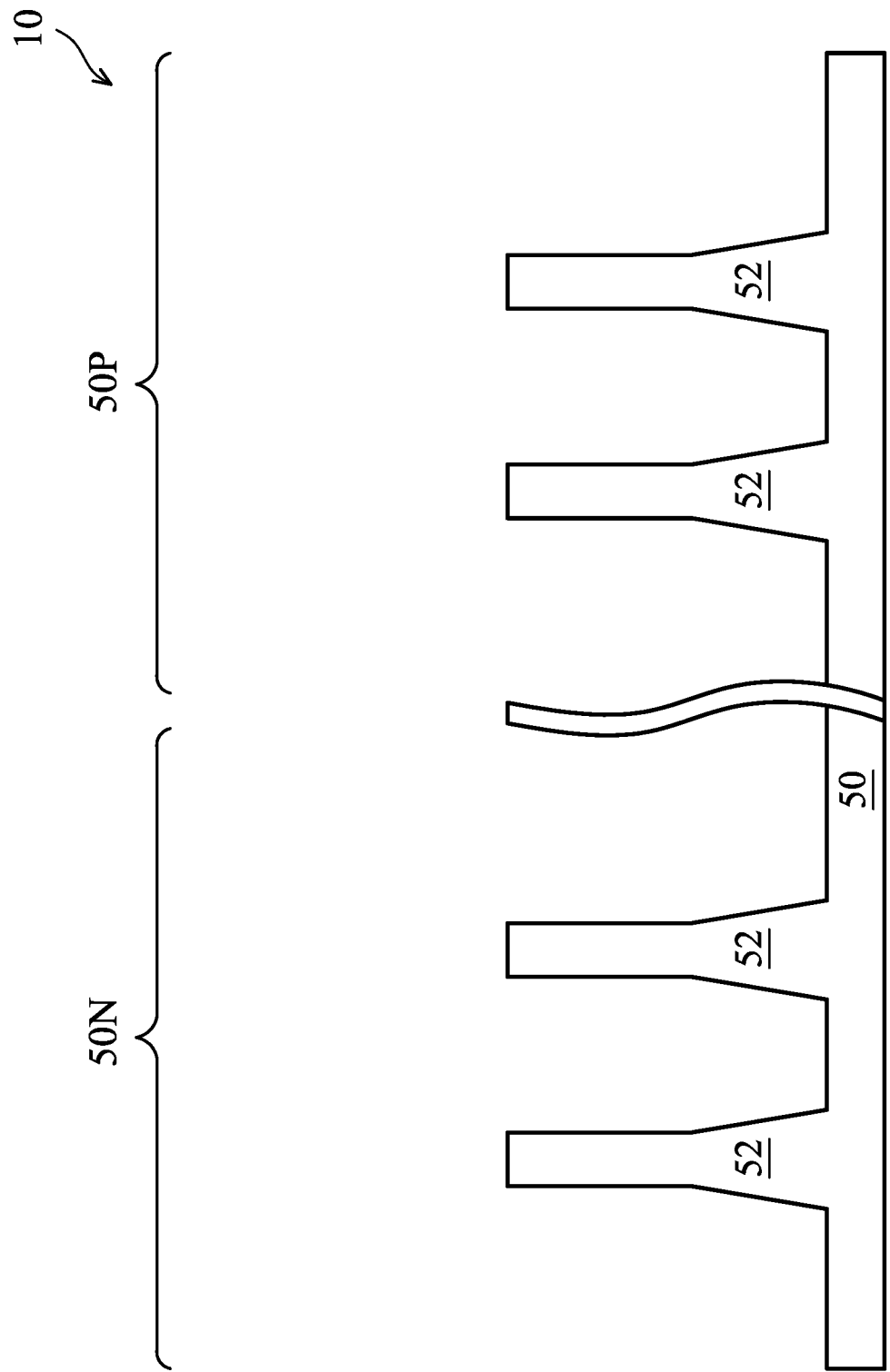

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
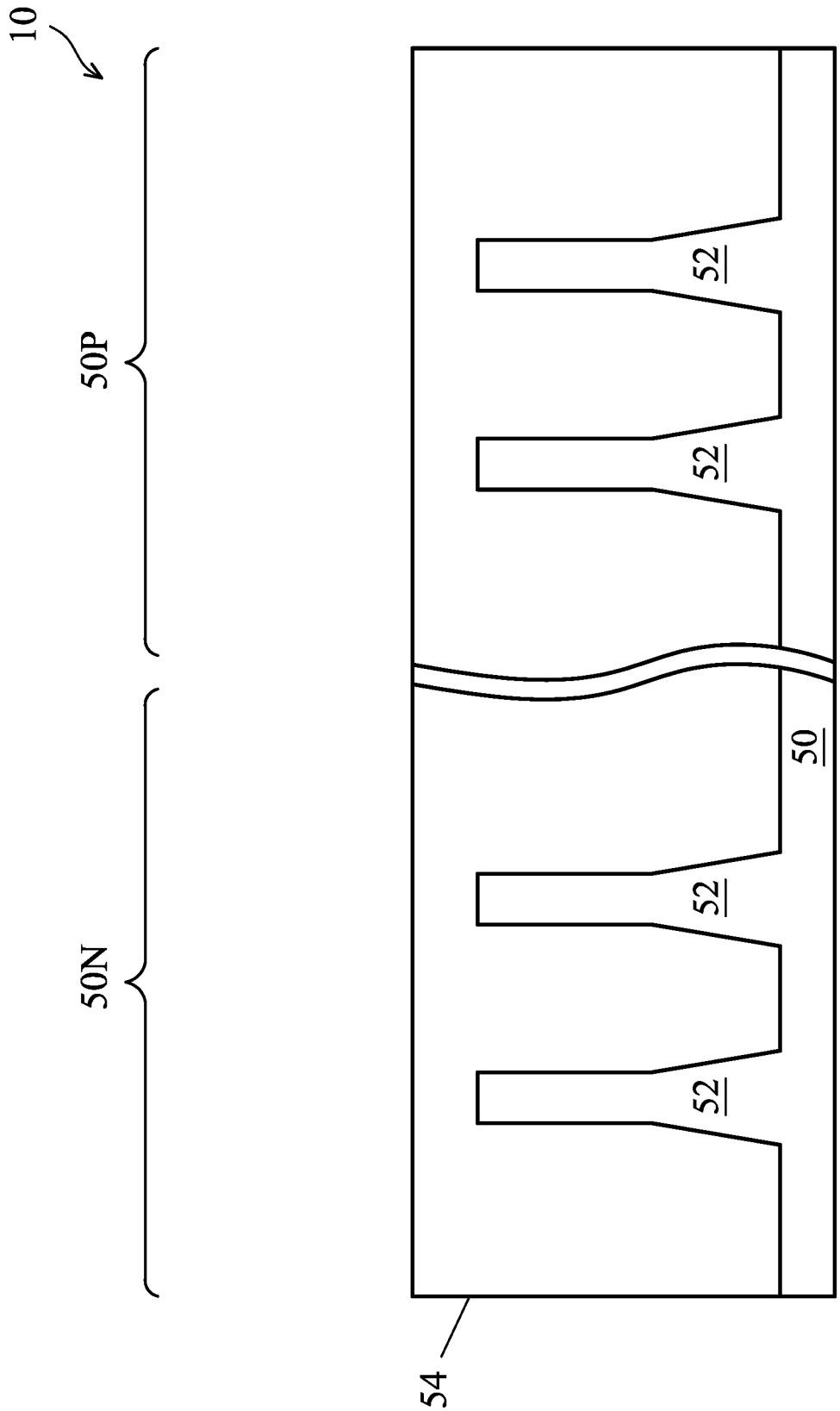

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
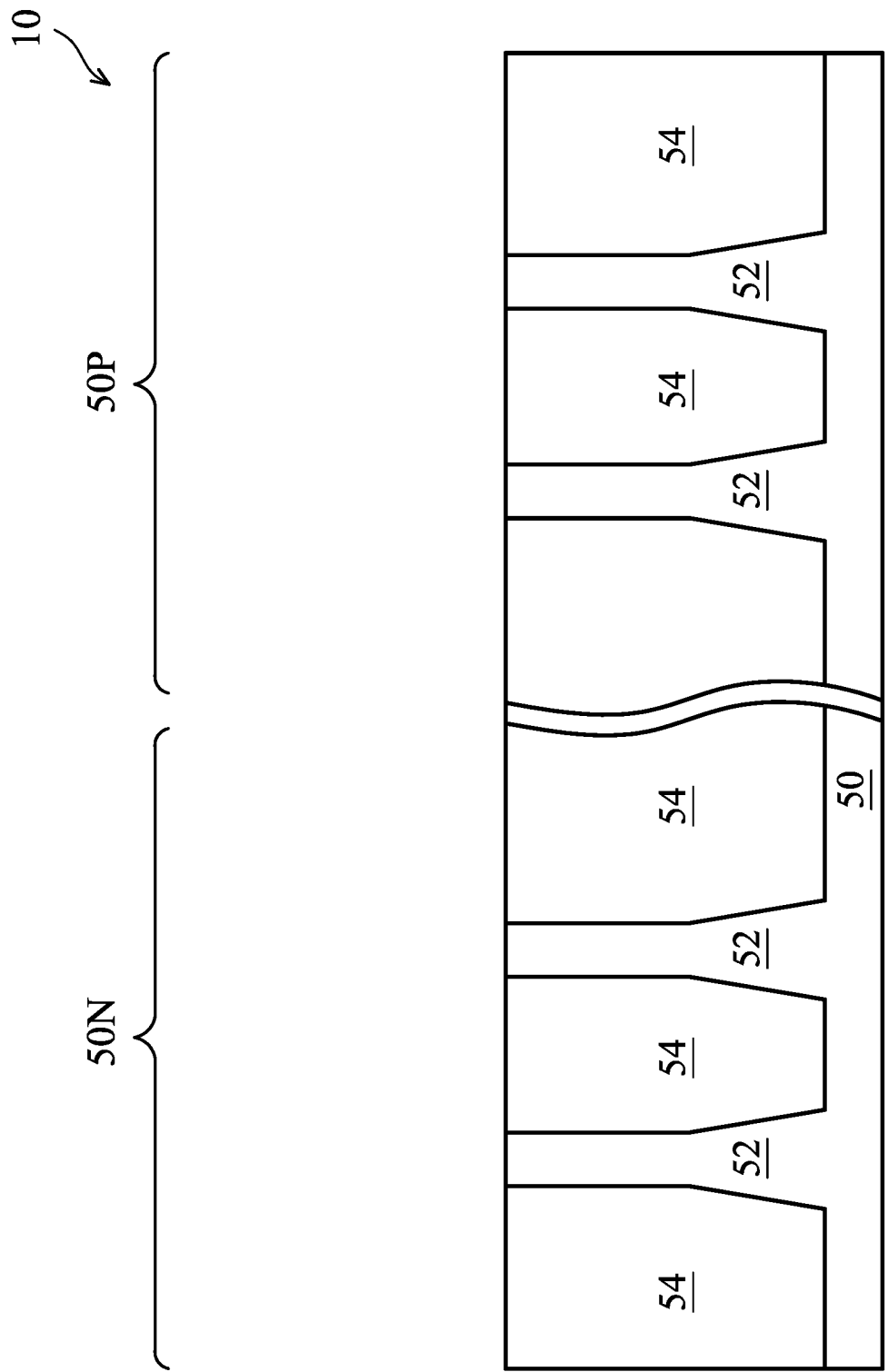

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
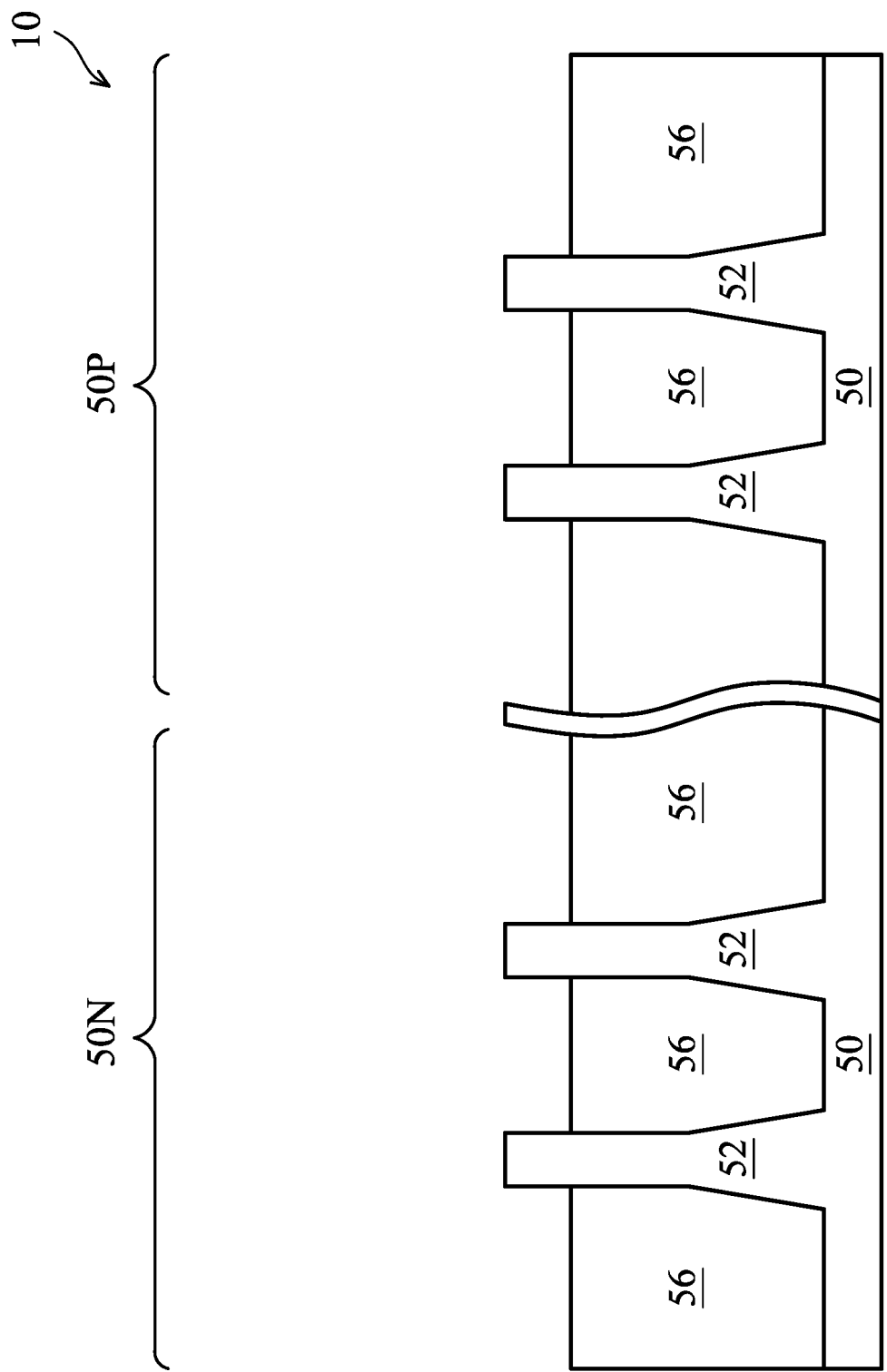

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorous, arsenic, antimony, or the like, and implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
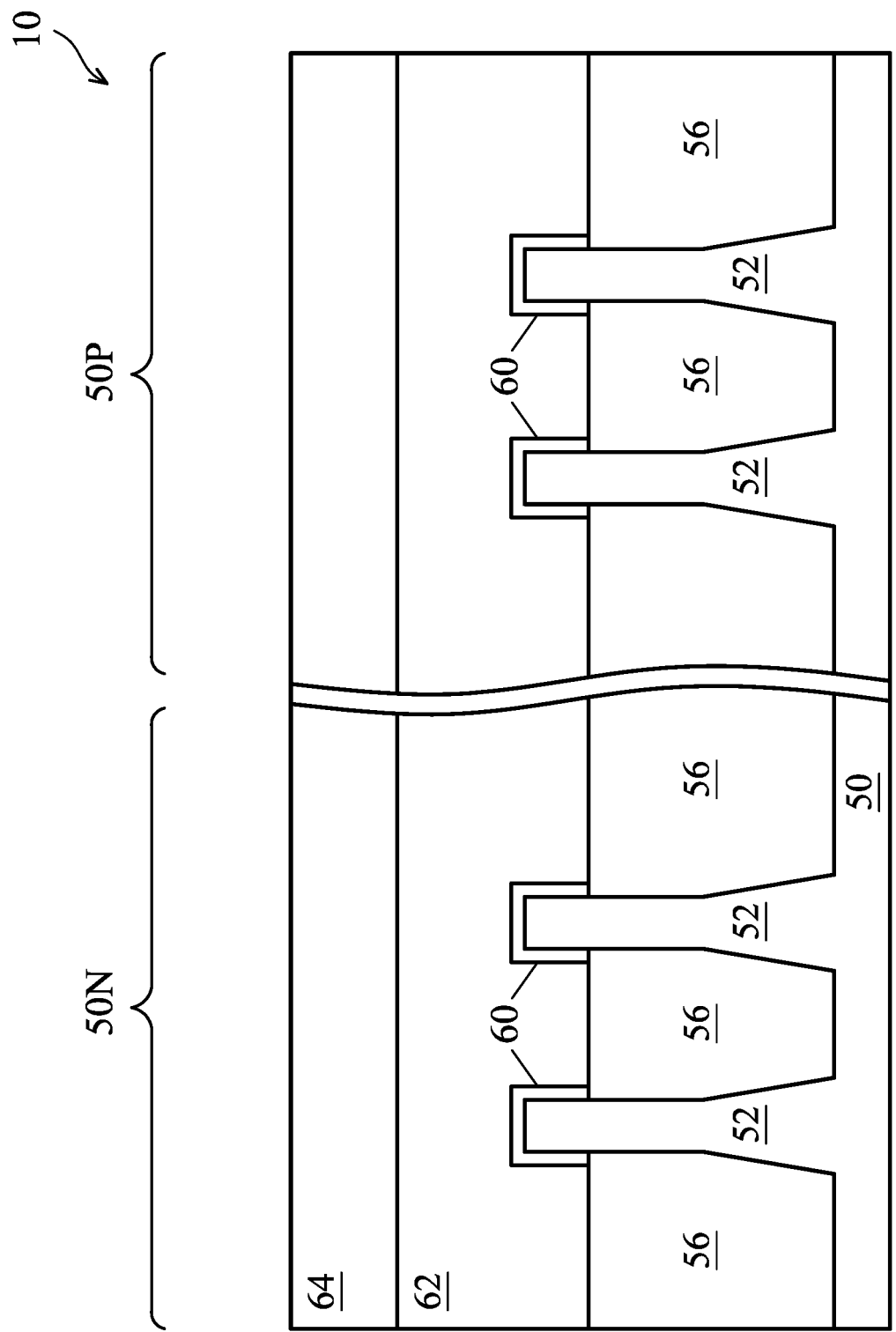

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8B:
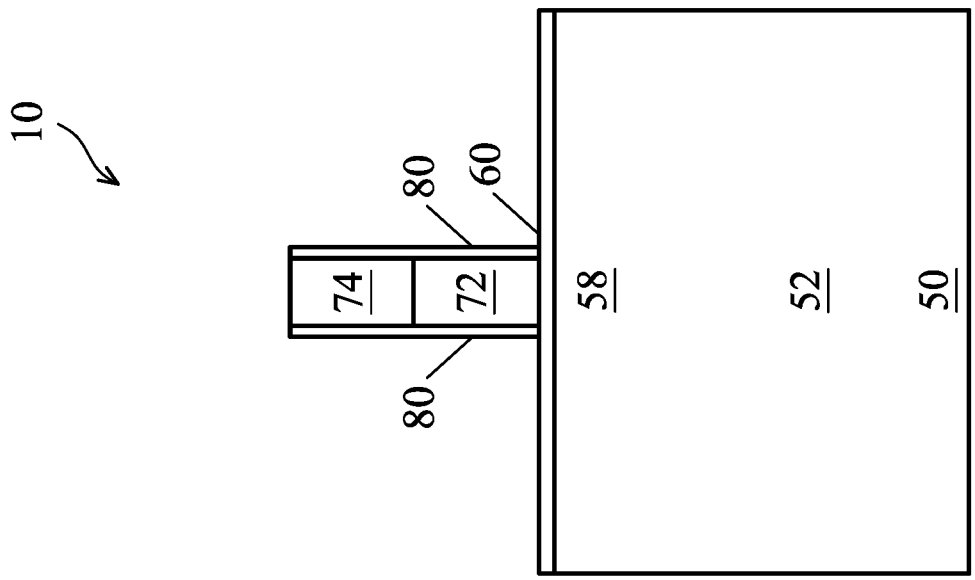
Figure 8A:
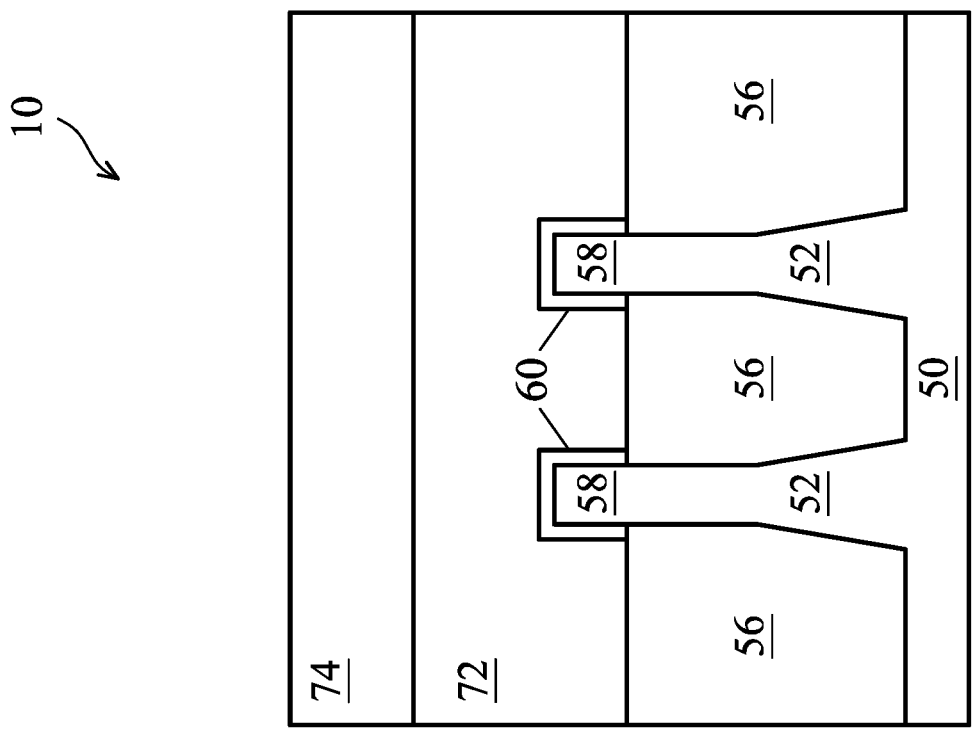

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
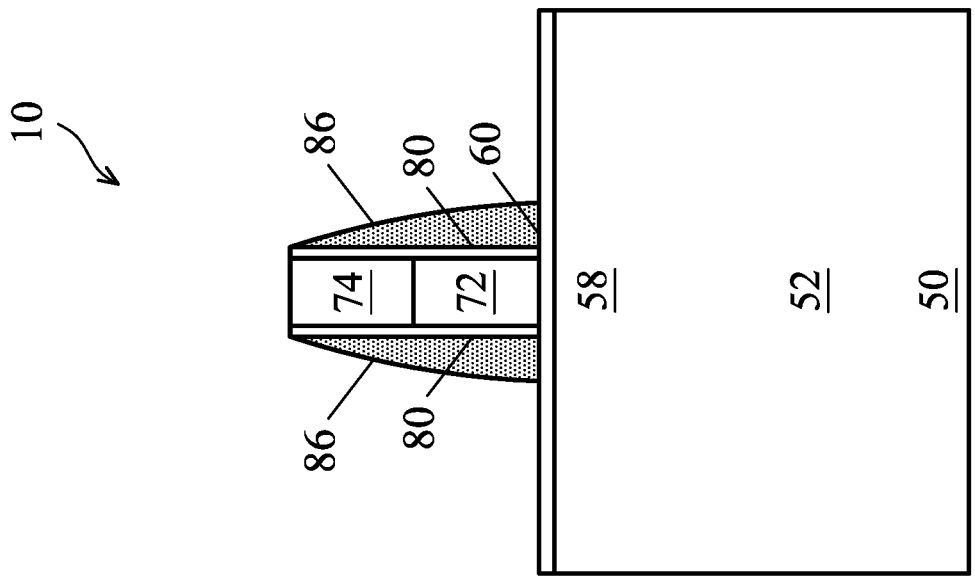
Figure 9A:
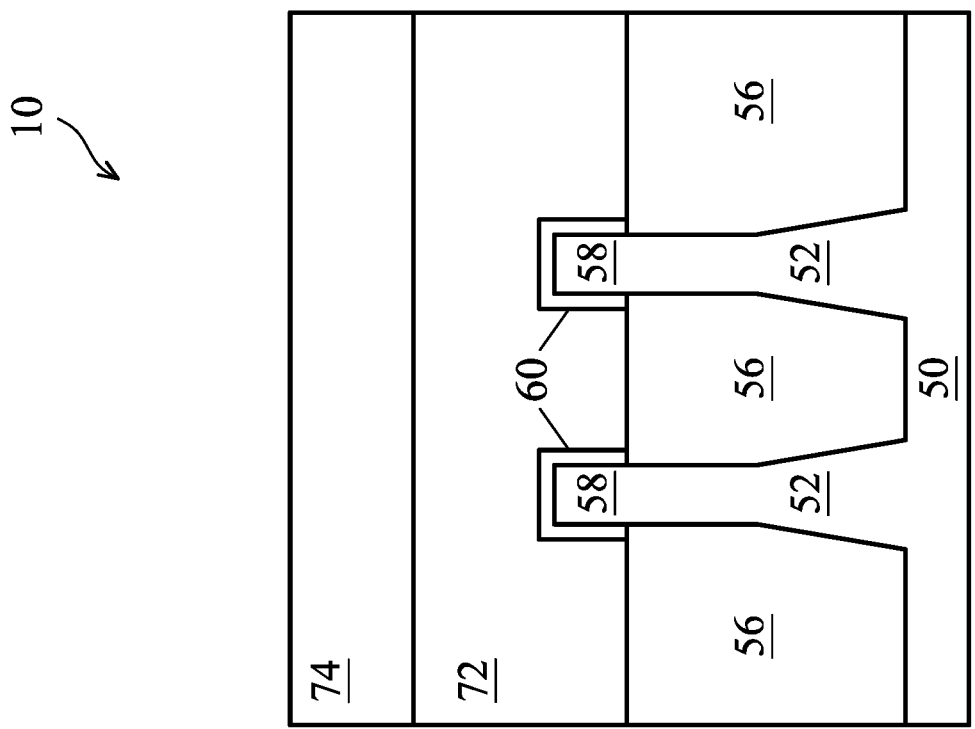

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 10 through 15, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

Figure 10:
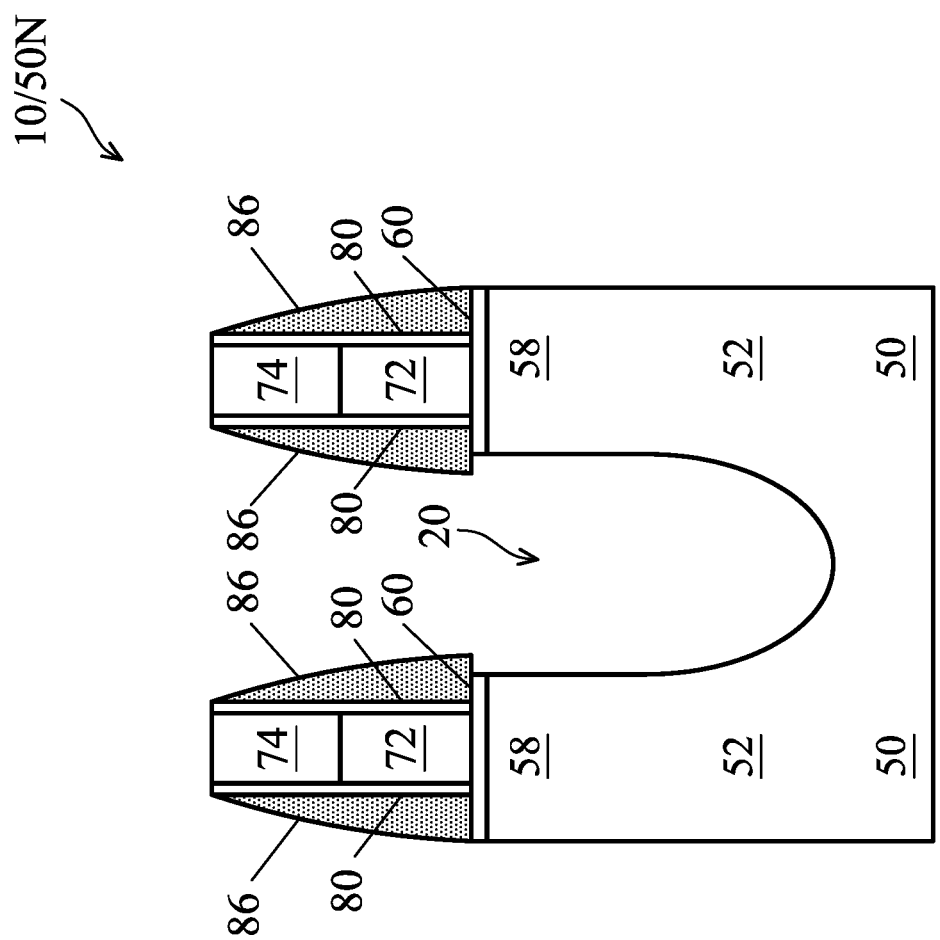

The epitaxial source/drain regions 82 in the n-type region 50N may be different and formed separately from the epitaxial source/drain regions 82 in the p-type region 50P. For example, FIGS. 10, 11, 12A, 13A, 14A, and 15A illustrate cross-sectional views along line B-B of FIG. 1 of forming the epitaxial source/drain regions 82 in the n-type region 50N. The steps described in FIGS. 10 through 15A may be performed while the p-type region 50P (not explicitly illustrated) is masked. In FIG. 10, source/drain regions of the fins 52 in the n-type region 50N are patterned to form recesses 20 in the fins 52. For example, recesses 20 may be formed in the fins 52 on opposing sides of the dummy gates 72 (e.g., see FIG. 19B), such as between adjacent dummy gates 72. Patterning the recesses 20 may be achieved by, for example, a combination of photolithography and etching. In some embodiments, the fins 52 may be over etched such that the recesses 20 extend directly under the gate spacers 86.

Figure 11:
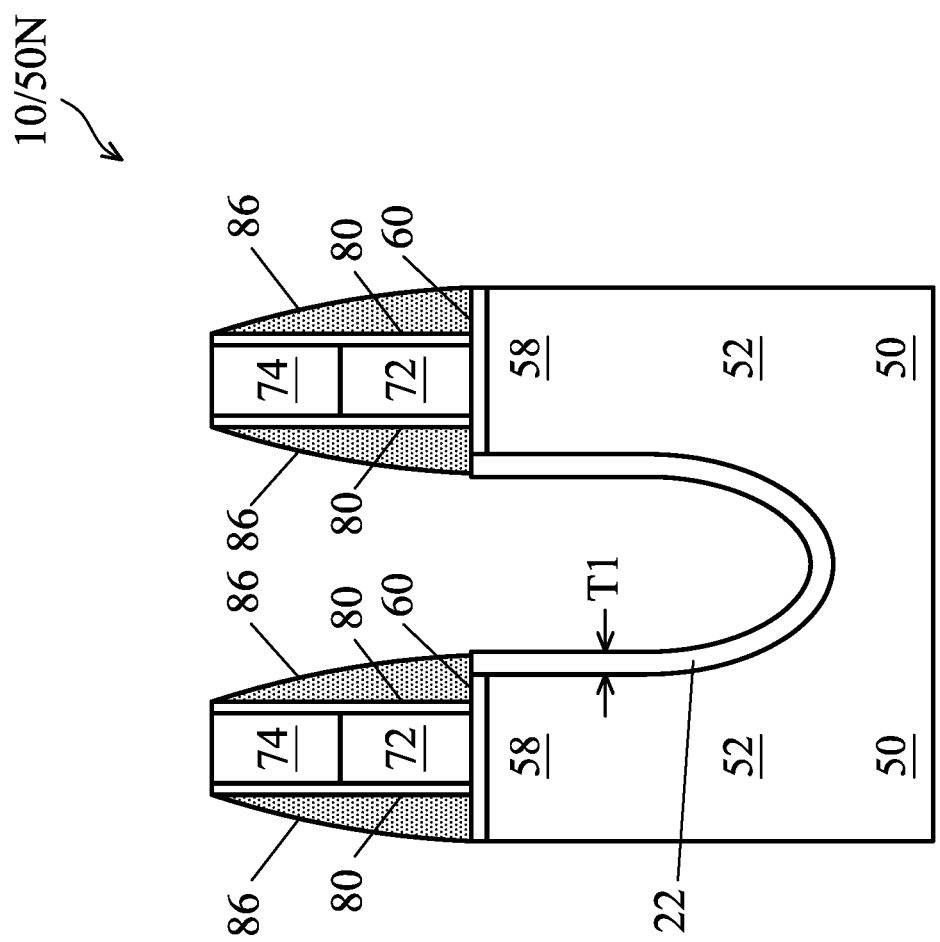

In FIG. 11, optional epitaxial regions 22 are grown in the recesses 20. The epitaxial regions 22 may only partially fill the recesses 20. For example, the epitaxial regions 22 may be grown to cover sides and bottoms of the recesses 20. The epitaxial regions 22 may be grown by any acceptable process and may include any acceptable material, such as appropriate for n-type FinFETs. For example, if the fin 52 is silicon, the epitaxial regions 22 may include silicon, silicon carbide, silicon phosphide, or the like. In some embodiments, a material of the epitaxial regions 22 in the n-type region 50N may be chosen to exert a tensile strain on the channel regions 58. In some embodiments, the epitaxial regions 22 have a thickness T1 in a range of about 3 nm to about 7 nm.

The epitaxial regions 22 and/or the fins 52 may be implanted with dopants during the epitaxy using an in-situ doping process. For example, first n-type impurities may be flowed into the deposition chamber while the epitaxial regions 22 are grown. The first n-type impurities implanted in the epitaxial regions 22 may be phosphorus, arsenic, carbon, antimony, or the like. The epitaxial regions 22 may have an impurity concentration in a range of about $5 \times 10^{19}$ cm$^{-3}$ to about $2 \times 10^{20}$ cm$^{-3}$ for example. In other embodiments, the epitaxial regions 22 may have a different impurity concentration. The impurity concentration in the epitaxial regions 22 may be constant throughout the epitaxial regions 22 or it may be varied. For example, the epitaxial regions 22 may have a gradient impurity concentration that increases in a direction away from sidewalls of the fins 52 on which the epitaxial regions 22 is grown.

Figure 12A:
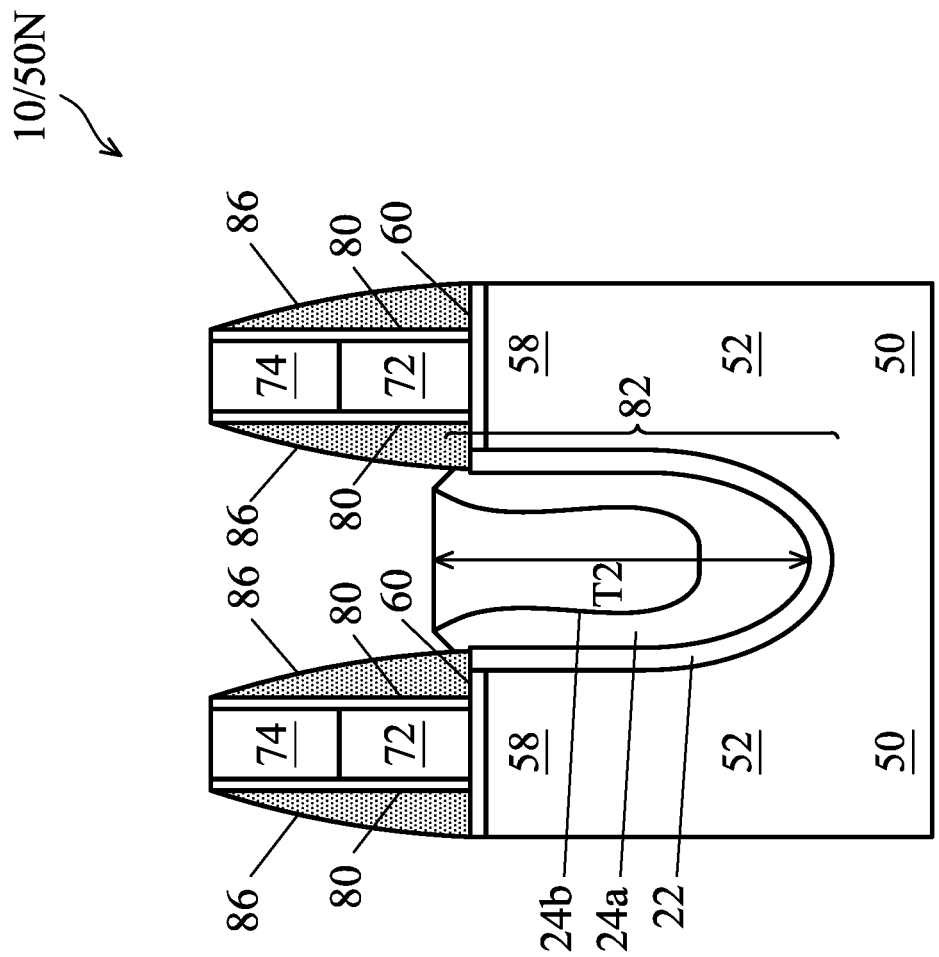

In FIG. 12A, the epitaxial growth process may continue to fill remaining portions of the recesses 20 with epitaxial regions 24a and 24b. Growing the epitaxial regions 24a and 24b may be performed in-situ (e.g., in a same chamber) as the epitaxial regions 22 and using a same process as the epitaxial regions 22. Further, the epitaxial regions 24a and 24b may comprise a same material as the epitaxial regions 22, such as, silicon, silicon carbide, silicon phosphide, or the like. In some embodiments, a material of the epitaxial regions 24a and 24b in the n-type region 50N may be chosen to exert a same type of stress (e.g., tensile) on the channel regions 58 as the epitaxial regions 22. In some embodiments, the epitaxial regions 24a and 24b have a combined thickness T2 in a range of about 50 nm to about 70 nm. The thickness T2 may be measured from a topmost surface of the epitaxial regions 24b to a bottommost point of the epitaxial regions 24a.

The epitaxial regions 24a, the epitaxial regions 24b, and/or the fins 52 may be implanted with dopants during the epitaxy using an in-situ doping process. For example, second n-type impurities may be flowed into the deposition chamber while the epitaxial regions 22 are grown. The second n-type impurities implanted in the epitaxial regions 24a and 24b may be phosphorus, arsenic, carbon, antimony, or the like. In some embodiments, the second n-type may be a different element than the first n-type impurities implanted in the epitaxial regions 22. For example, in a specific embodiment, the epitaxial regions 22 may be implanted with arsenic, and the epitaxial regions 24a and 24b may be implanted with phosphorous. Other combinations of n-type impurities may be used in other embodiments.

Further, a dopant concentration of the second n-type impurities may be different in the epitaxial regions 24a and 24b. For example, a concentration of the second n-type impurities in the epitaxial regions 24b may be greater than the second n-type impurities in the epitaxial regions 24a. This may be achieved, for example, by varying a flow rate and/or concentration of a dopant gas flowed into the process chamber during the epitaxy. In some embodiments, the epitaxial regions 24a have an impurity concentration in a range of about $5 \times 10^{20}$ cm$^{-3}$ to about $10^{21}$ cm$^{-3}$, and the epitaxial regions 24b have an impurity concentration in in a range of about $10^{21}$ cm$^{-3}$ to about $3 \times 10^{21}$ cm$^{-3}$. In other embodiments, the epitaxial regions 24a and/or 24b may have different impurity concentrations. The impurity concentration in the epitaxial regions 24a and/or 24b may be constant throughout respective epitaxial regions 24a/24b, or it may be varied. For example, the epitaxial regions 24a/24b may each have a gradient, impurity concentration that increases in a direction towards a top surface of the fins 52.

Thus, epitaxial source/drain regions 82 are formed. The epitaxial source/drain regions 82 includes the epitaxial regions 22, 24a, and 24b. The epitaxial regions 22 include first impurities (e.g., arsenic, or the like), and the epitaxial regions 24a and 24b include second impurities (e.g., phosphorus, or the like). The epitaxial regions 22 may line sides and bottoms of the epitaxial regions 24a/24b. Alternatively, one or more of the epitaxial regions 22, 24a, or 24b may be omitted from the epitaxial source/drain regions 82.

Figure 12C:
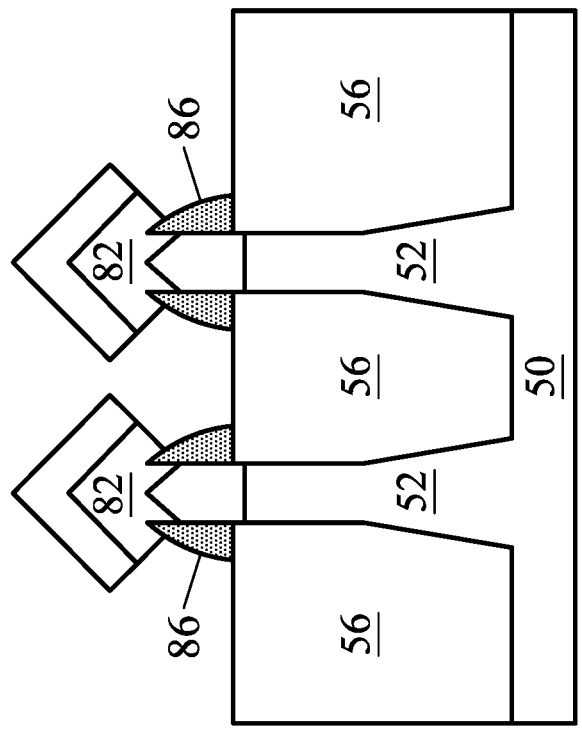
Figure 12B:
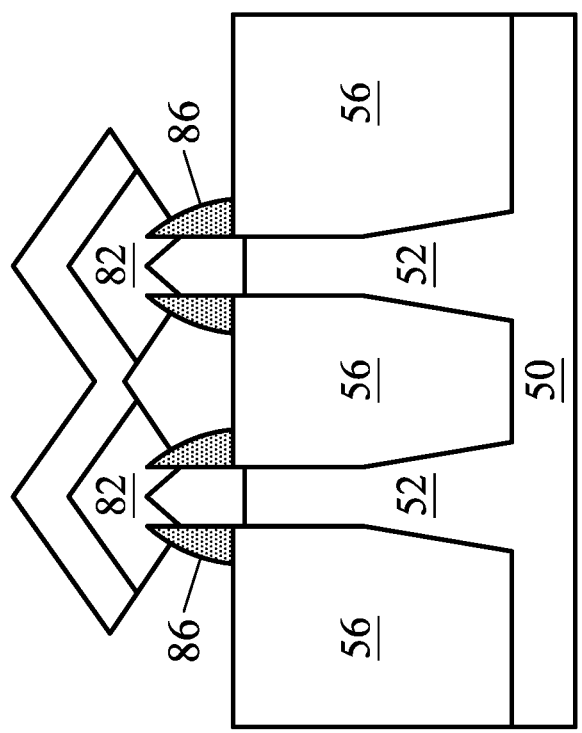

The epitaxial source/drain regions 82 may have surfaces raised from respective surfaces of the fins 52 and may have facets. As a result of the epitaxy processes used to form the epitaxial source/drain regions 82, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 12B. In other embodiments, adjacent source/drain regions 82 remain separated after the epitaxy process is completed as illustrated by FIG. 12C. In the embodiments illustrated in FIGS. 12B and 12C, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 13A:
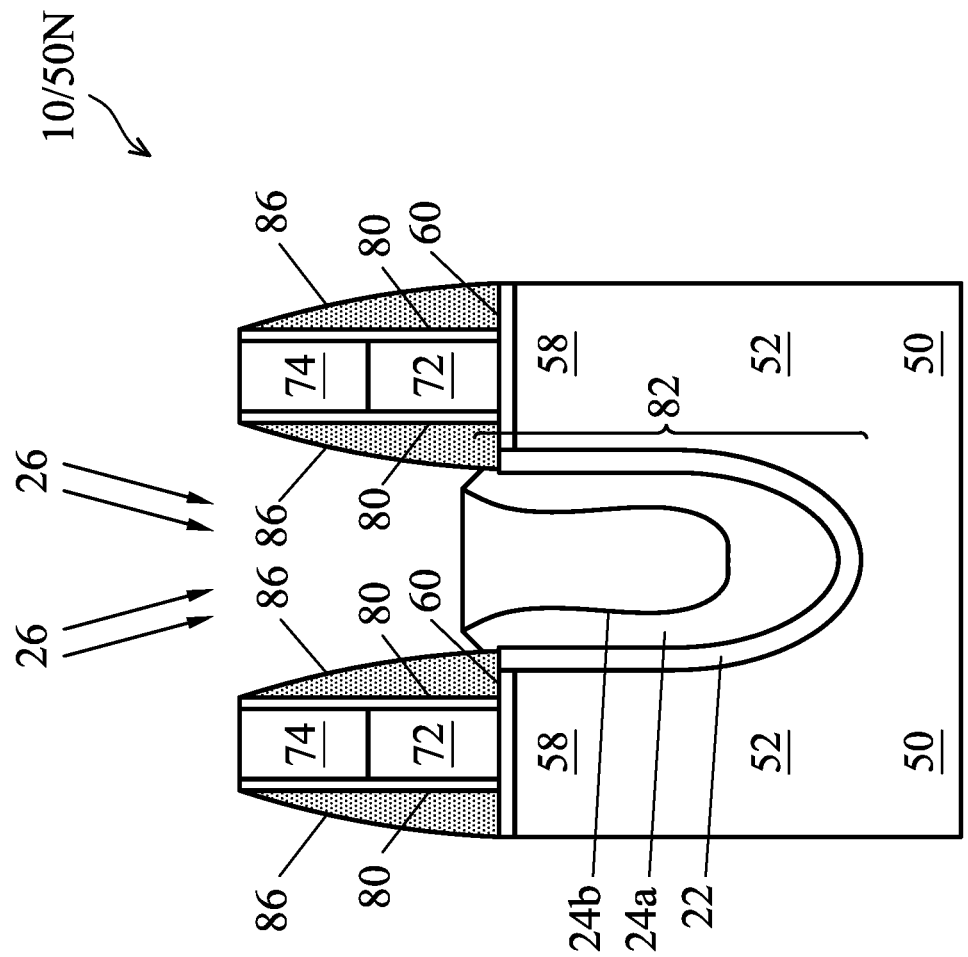

FIGS. 13A through 14B illustrate additional implantation steps, which are formed on the epitaxial source/drain regions 82 after the epitaxial source/drain regions 82 are fully grown in some embodiments. In FIGS. 13A and 13B, a first implantation 26 is performed on the epitaxial source/drain regions 82. The first implantation 26 may be performed in-situ with forming the epitaxial source/drain regions 82 or it may be performed ex-situ of forming the epitaxial source/drain regions 82.

In some embodiments, the first implantation 26 implants third n-type impurities into the epitaxial source/drain regions 82. The third impurities may be selected to have a relatively low formation enthalpy, and may be, arsenic, antimony, carbon, or the like. As will be explained in greater detail below, due to its relatively low formation enthalpy, the third impurities are more attracted to vacancies (V) in the epitaxial source/drain regions 82, and the third impurities may form inactive clusters with the vacancies. For example, in embodiments where the third impurities are arsenic, As$_4$V may form as a relatively stable complex (e.g., be deactivated to form an inactive cluster). Accordingly, the third impurities help reduce diffusion of fourth impurities that are subsequently implanted into the epitaxial source/drain regions 82. For example, vacancies in the silicon lattice has a stronger attraction to the third impurities (e.g., arsenic) than the fourth impurities (e.g., phosphorous). Accordingly, diffusion of the fourth impurity may be slowed if the vacancies are consumed by forming stable complexes with the third impurity. As a result, source/drain contact resistance can be lowered. Further, implanting the third impurities may provide improved junction abruptness and reduced diffusion compared to a junction formed by implanting only the fourth impurities described below. The third impurities implanted in the first implantation 26 may be the same or different as the first impurities in the epitaxial regions 22.

Figure 13B:
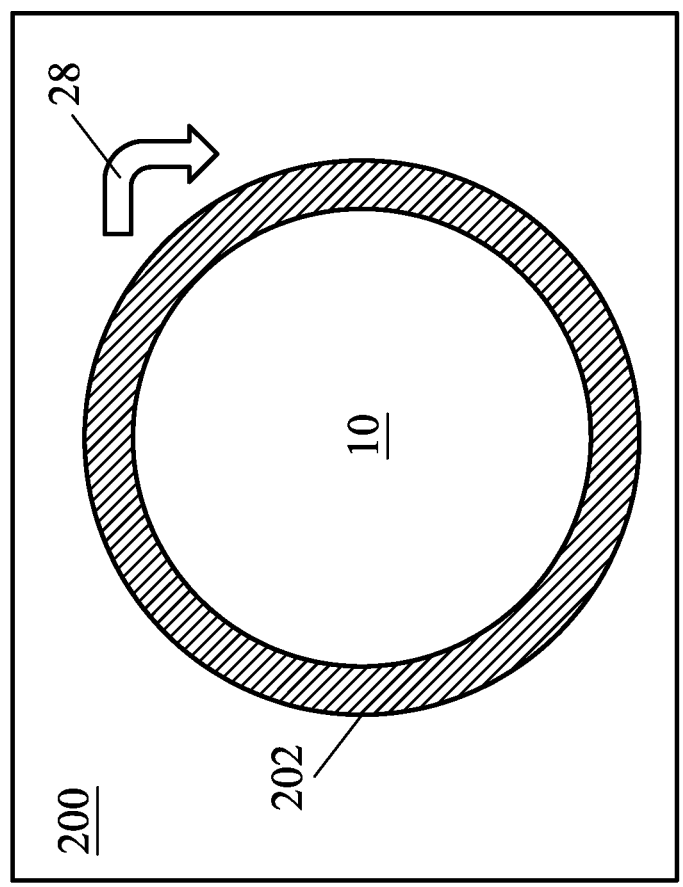

The first implantation 26 may use arsenic, antimony, carbon, or the like as a dopant gas. Other carrier gases (e.g., nitrogen, argon, helium, or the like) may also be present. The first implantation 26 may be performed at an implantation energy in a range of about 2 keV to about 20 keV, such as about 4 keV. An implantation dosage of the first implantation 26 may be in a range of about $5 \times 10^{14}$ cm$^{-3}$ to about $10^{22}$ cm$^{-3}$. An implantation angle of the first implantation 26 may be in a range of about 3° to about 15°, and a rotation angle of the first implantation 26 may in a range of 0° to 360°. For example, the implantation angle may refer to an angle at which the third impurities are implanted from above into the epitaxial source/drain regions 82 relative a major surface of the substrate. Further, a rotation angle may refer to the rotation of the wafer 10 around the process chamber during the first implantation 26. For example, referring to FIG. 13B, a top down view of a process chamber 200 is illustrated. The first implantation 26 may be performed in the process chamber 200. The process chamber 200 includes a platen 202, which supports the wafer 10 during the first implantation 26. The platen may further be connected to a motor, which rotates the wafer 10 according to a rotation angle of the first implantation 26 as indicated by arrow 28. The wafer 10 may be rotated any number times. For example, in some embodiments, the wafer 10 is not rotated throughout an entire duration of the first implantation 26. In other embodiments, the wafer 10 is rotated 90° twice. In yet other embodiments, the wafer 10 is rotated 45° four times. The rotation angle and number of times the wafer is rotated may affect a post-anneal implantation profile of the completed structure (e.g., see FIGS. 15A through 17). Accordingly, by adjusting the rotation angle and rotation times during the first implantation 26, different implantation profiles can be achieved. Although FIG. 13B illustrates a process chamber 200 with a specific configuration processing a single wafer 10, other configurations are also possible, and a different number of wafers may be processed concurrently in the process chamber 200.

Figure 14A:
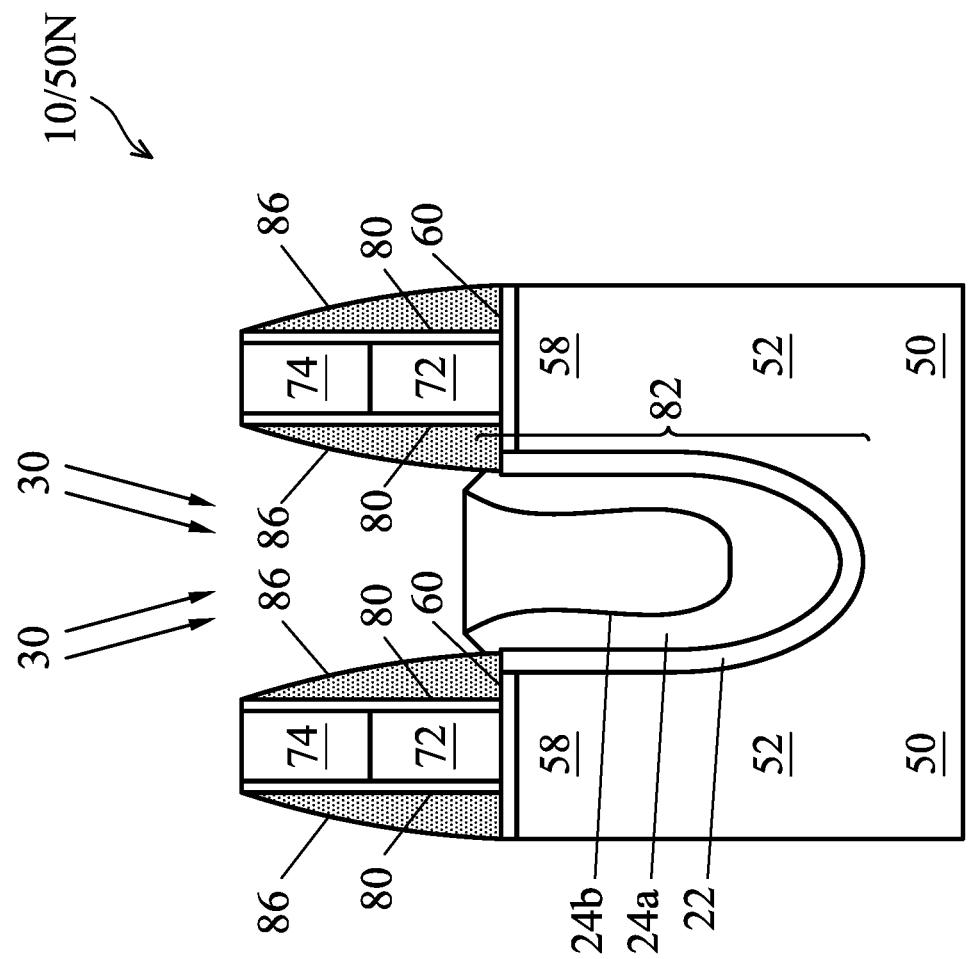
Figure 14B:
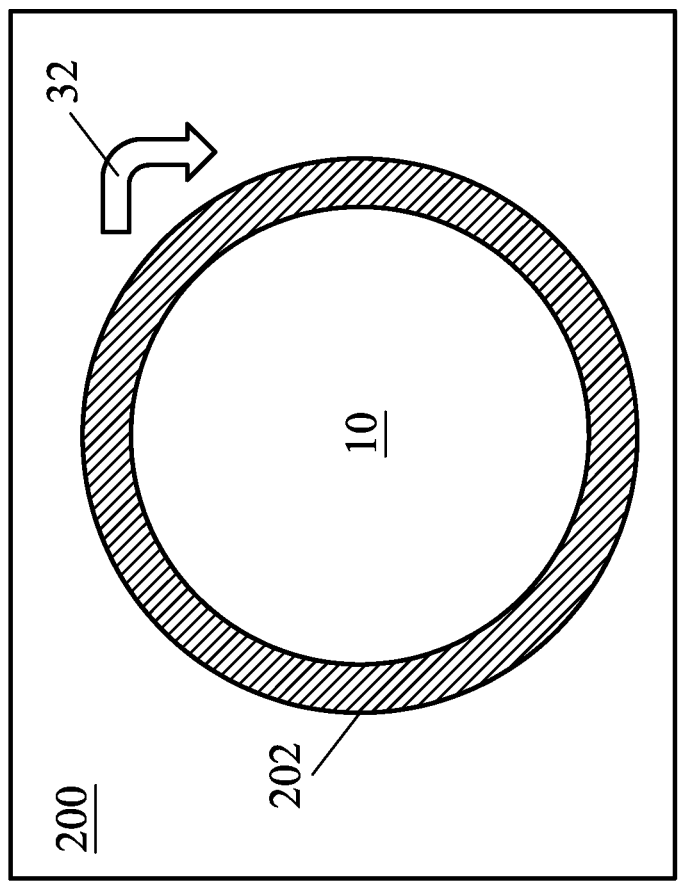

Next, in FIGS. 14A and 14B, a second implantation 30 is performed on the epitaxial source/drain regions 82. The second implantation 30 may be performed in-situ or ex-situ of the first implantation 26. In some embodiments, no annealing processes are performed between the first implantation 26 and the second implantation 30.

In some embodiments, the second implantation 30 implants fourth impurities into the epitaxial source/drain regions 82. The fourth impurities may be selected to have a relatively high formation enthalpy compared to the third impurities implanted in the first implantation 26. For example, the fourth impurities may comprise phosphorous (e.g., phosphorous dimer ($P_2$)), or the like. In some particular embodiments, the first implantation 26 implants arsenic, and the second implantation 30 implants phosphorous dimer. Due to the relatively high formation enthalpy of the fourth impurities compared to the third impurities, the fourth impurities are less attracted to vacancies (V) in the epitaxial source/drain regions 82. For example, the third impurities may form stable complexes with the vacancies, thereby reducing deactivation (e.g., through the formation of complexes of the fourth impurities and the vacancies) and diffusion of the fourth impurities. As a result, contact resistance can be lowered due to a higher concentration of the fourth impurities in a contact area of the epitaxial source/drain regions 82 (e.g., top portions of the epitaxial source/drain regions 82). Further, including third impurities may provide improved junction abruptness and reduced diffusion than a junction formed by implanting only the fourth impurities.

The second implantation 30 may use phosphorous (e.g., phosphorous dimer ($P_2$)), or the like as a dopant gas. Other carrier gases (e.g., nitrogen, argon, helium, or the like) may also be present. The second implantation 30 may be performed at an implantation energy in a range of about 2 keV to about 20 keV. An implantation dosage of the second implantation 30 may be at least about $4 \times 10^{15}$ cm$^{-3}$, such as in a range of about $10^{18}$ cm$^{-3}$ to about $10^{22}$ cm$^{-3}$. It has been observed that by implanting the fourth impurities at a high dose (e.g., in the above range), source/drain contact resistance can be reduced by providing increased dopants in a contact area of the epitaxial source/drain regions 82. An implantation angle of the second implantation 30 may be in a range of about 3° to about 15°, and a rotation angle of the second implantation 30 may be in a range of 0° to 360°. For example, the implantation angle may refer to an angle at which the fourth impurities are implanted from above into the epitaxial source/drain regions 82 relative a major surface of the substrate. Further, a rotation angle may refer to the rotation of the wafer 10 around the process chamber during the second implantation 30. For example, referring to FIG. 14B, a top down view of the process chamber 200 is illustrated. The second implantation 30 may be performed in the same process chamber 200 as the first implantation 26. Alternatively, the second implantation 30 may be performed in a different process chamber 200. The wafer 10 is rotated on the platen 202 according to a rotation angle of the second implantation 30 as indicated by arrow 32. The wafer 10 may be rotated any number times. For example, in some embodiments, the wafer 10 is not rotated throughout an entire duration of the second implantation 30. In other embodiments, the wafer 10 is rotated 90° twice during the second implantation 30. In yet other embodiments, the wafer 10 is rotated 45° four times during the second implantation 30. The rotation angle and number of times the wafer is rotated may affect a post-anneal implantation profile of the completed structure (e.g., see FIGS. 15A through 17). Accordingly, by adjusting the rotation angle and rotation times during the first implantation 26 and/or the second implantation 30, different implantation profiles can be achieved. Although FIG. 14B illustrates a process chamber 200 with a specific configuration processing a single wafer 10, other configurations are also possible, and a different number of wafers may be processed concurrently in the process chamber 200.

Subsequently, an annealing process may be performed to activate the third dopants and the fourth dopants. For example, in some embodiments, the annealing process may include a microsecond anneal (OSA) followed by a laser spike anneal (LSA). In some embodiments, the junction profile of fourth dopants (e.g., phosphorous) may be the same after the annealing process (e.g., after the µSSA/LSA) as before the annealing process. Accordingly, the implantation of a lower formation enthalpy element may help reduce diffusion during the annealing process. The µSSA may be performed at a temperature in a range of about 1050° C. to about 1150° C., and the LSA may be performed at a temperature in a range of about 1100° C. to about 1250° C. Other anneal process(es) may be used in other embodiments.

Figure 15A:
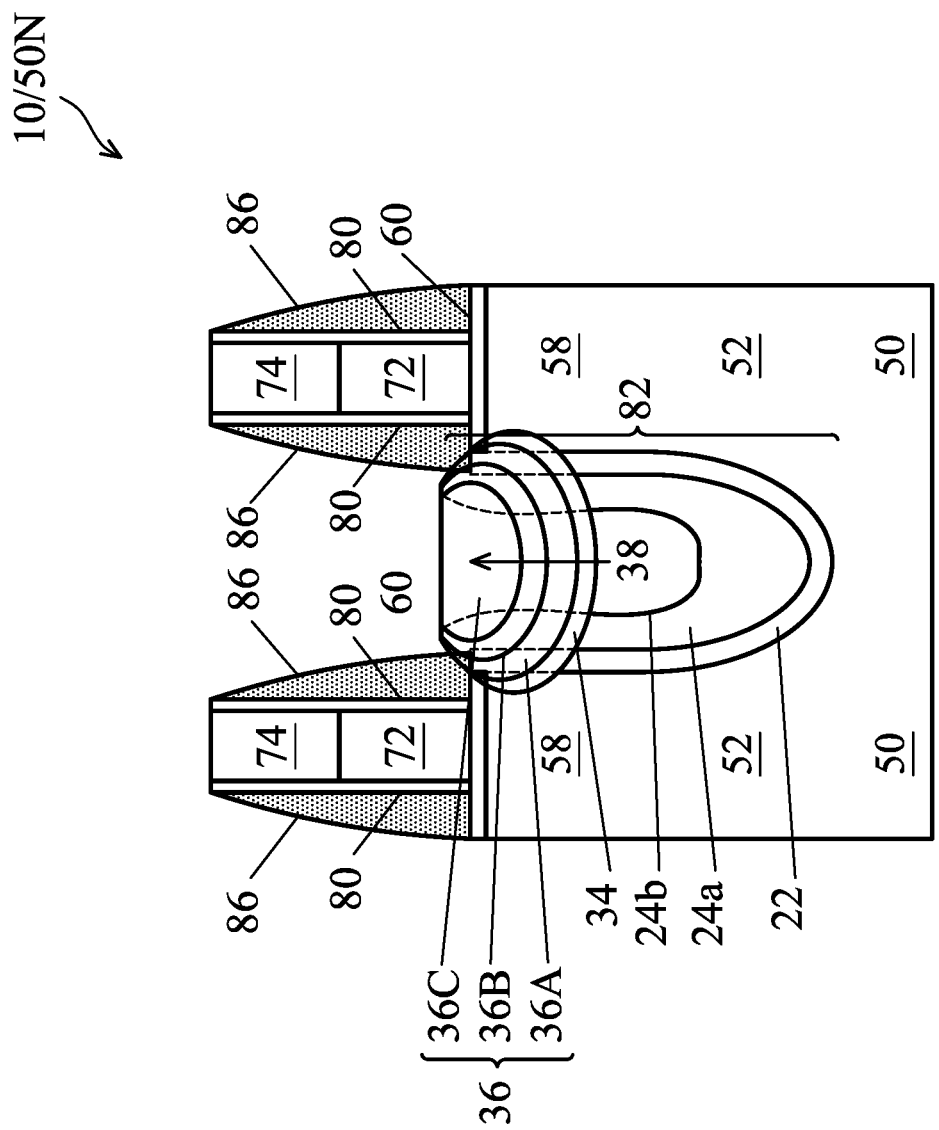
Figure 15C:
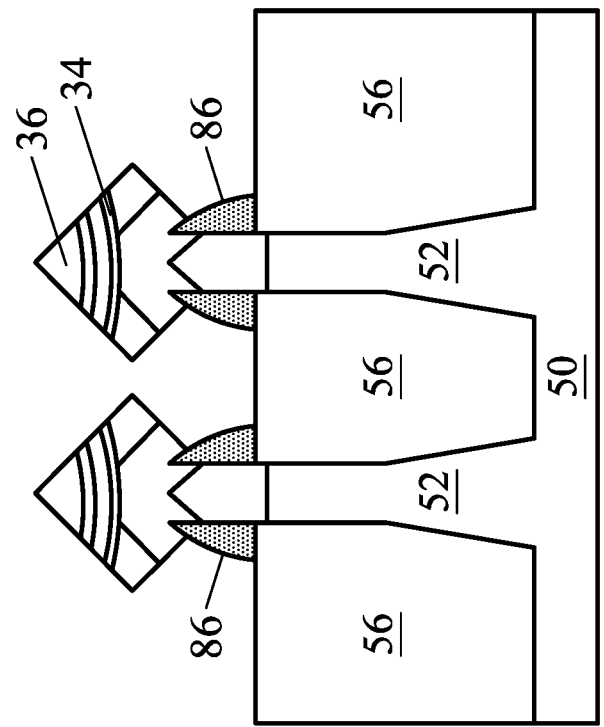
Figure 15B:
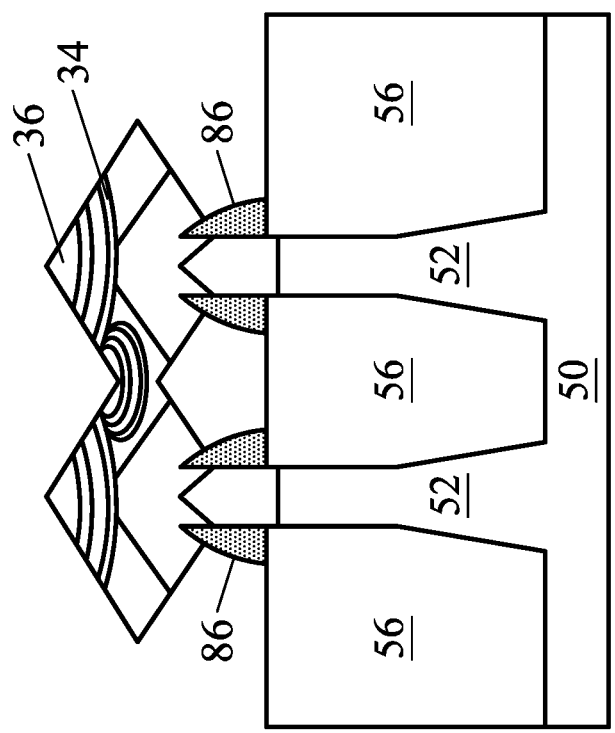

FIGS. 15A, 15B, and 15C illustrate the resulting structure after the annealing process according to some embodiments. FIG. 15A illustrates the structure along the line B-B of FIG. 1; FIG. 15B illustrates the structure along the line C-C of FIG. 1 for a merged epitaxial source/drain regions 82; and FIG. 15C illustrates the structure along the line C-C of FIG. 1 for unmerged epitaxial source/drain regions 82. As illustrated, doped regions 34 and 36 are formed at a top of the epitaxial source/drain regions 82 and the fins 52. The doped regions 34 comprise the third impurities having the relatively low formation enthalpy, and the doped regions 36 comprise the fourth impurities having the relatively high formation enthalpy. In the embodiments of FIGS. 15A, 15B, and 15C, the sides and bottoms of the doped regions 36 may be covered by the doped regions 34. For example, the doped regions 34 may separate the doped regions 36 from the fins 52 and lower portions of the epitaxial source/drain regions 82. Further, doped regions 34 and 36 may further include additional impurities, such as, the first and/or second impurities implanted in the epitaxial source/drain regions 82 (e.g., implanted in-situ of respective epitaxial regions 22, 24A, and 24B). The original boundaries for the epitaxial regions 22, 24A, and 24B are illustrated in ghost for reference.

The doped regions 34 provides a steeper junction for improved short channel control (e.g., improved DIBL with channel length less than, e.g., 10 nm and reduced leakage current). For example, in experimental data, off current was reduced by at least 20% in embodiment transistors where both the third and fourth impurities were implanted compared to transistors where only the fourth impurities was implanted. Further, implanting the third impurities reduces diffusion of the fourth impurities, and a concentration of the fourth impurities in the doped regions 36 can be increased. As a result, contact resistance can be lowered. For example, in experimental data, source resistance ($R_s$) can be reduced by at least 20% through the implantation of a relatively low formation enthalpy impurities (e.g., the third impurities in the doped regions 34) prior to the implantation of the relatively high formation enthalpy impurities (e.g., the fourth impurities in the doped regions 36). For example, the additional As implantation can improve Rs by 20% or more compared to a structure without this As implantation.

The doped regions 36 may include regions 36A, 36B, and 36C, and a dopant concentration of fourth impurities in the regions 36A, 36B, and 36C may be different. For example, a concentration of the fourth impurities may be higher in the regions 36B than in the regions 36A, and a concentration of the fourth impurities may be higher in the regions 36C than in the regions 36B. The concentration of the fourth impurities in each of the regions 36A, 36B, and 36C may be varied or constant. For example, the doped region 36 may have a gradient concentration of the fourth impurities that increases in a direction towards a top surface of the epitaxial source/drain regions 82 (as indicated by arrow 38). Likewise, the concentration of the third impurities in the region 34 may be constant or varied. For example, the doped region 34 may have a gradient concentration of the third impurities that increases in the direction of arrow 38.

Figure 15D:
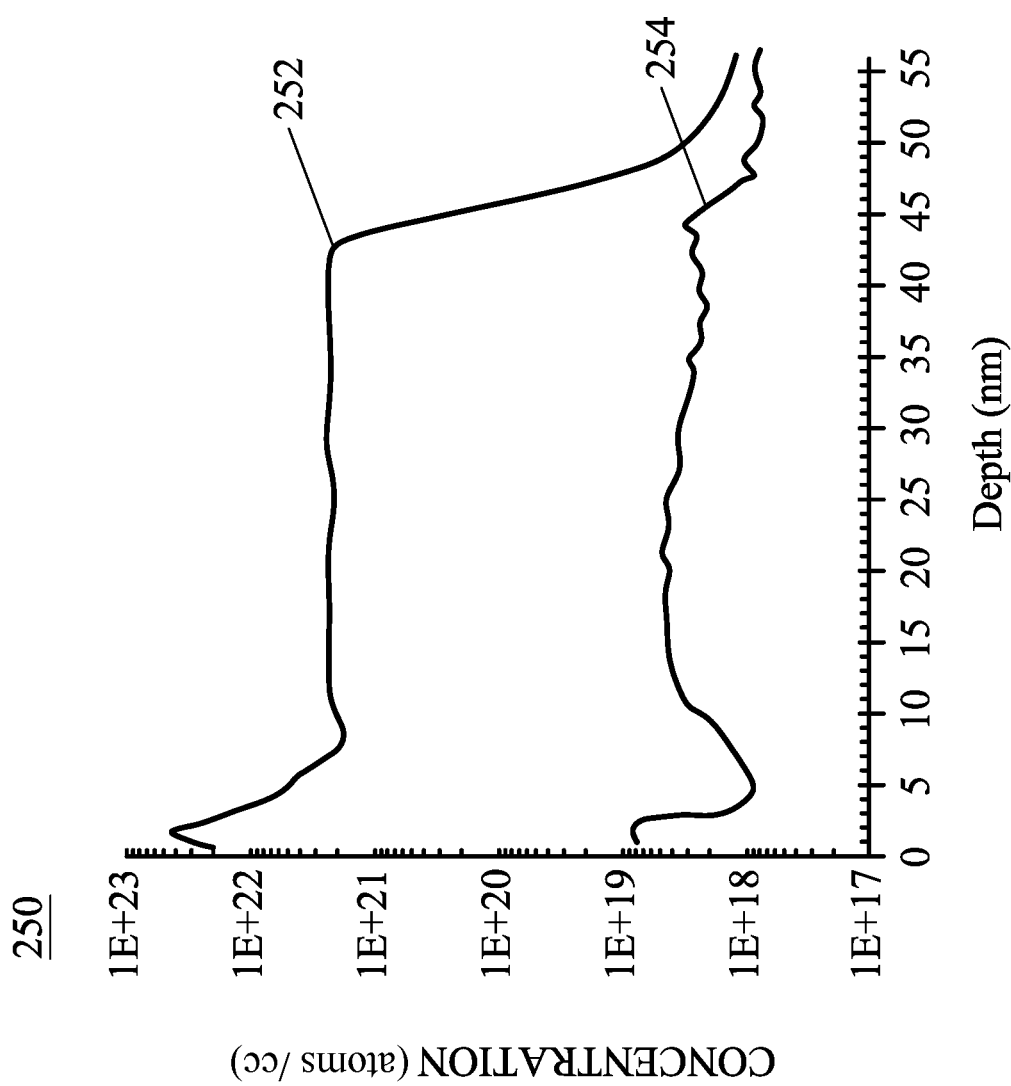
FIG. 15D illustrates impurity concentrations in a device in accordance with some embodiments.

FIG. 15D illustrates a graph 250 of impurity concentration in the epitaxial source/drain region 82 in an embodiment device such as along a center line of an epitaxial source/drain region 82. Line 252 represents a concentration of the fourth impurities (e.g., phosphorous dimer) while line 254 represents a concentration of the third impurities (e.g., arsenic). As illustrated, a post anneal concentration of the fourth impurities (e.g., phosphorous dimer) may be greater than $10^{22}$ cm$^{-3}$ in a contact area (e.g., the doped regions 36C) of the epitaxial source/drain regions 82. It has been observed that by providing a doped region with this concentration, source/drain contact resistance is advantageously reduced. Other impurity concentration profiles are also possible in other embodiments.

Figure 16:
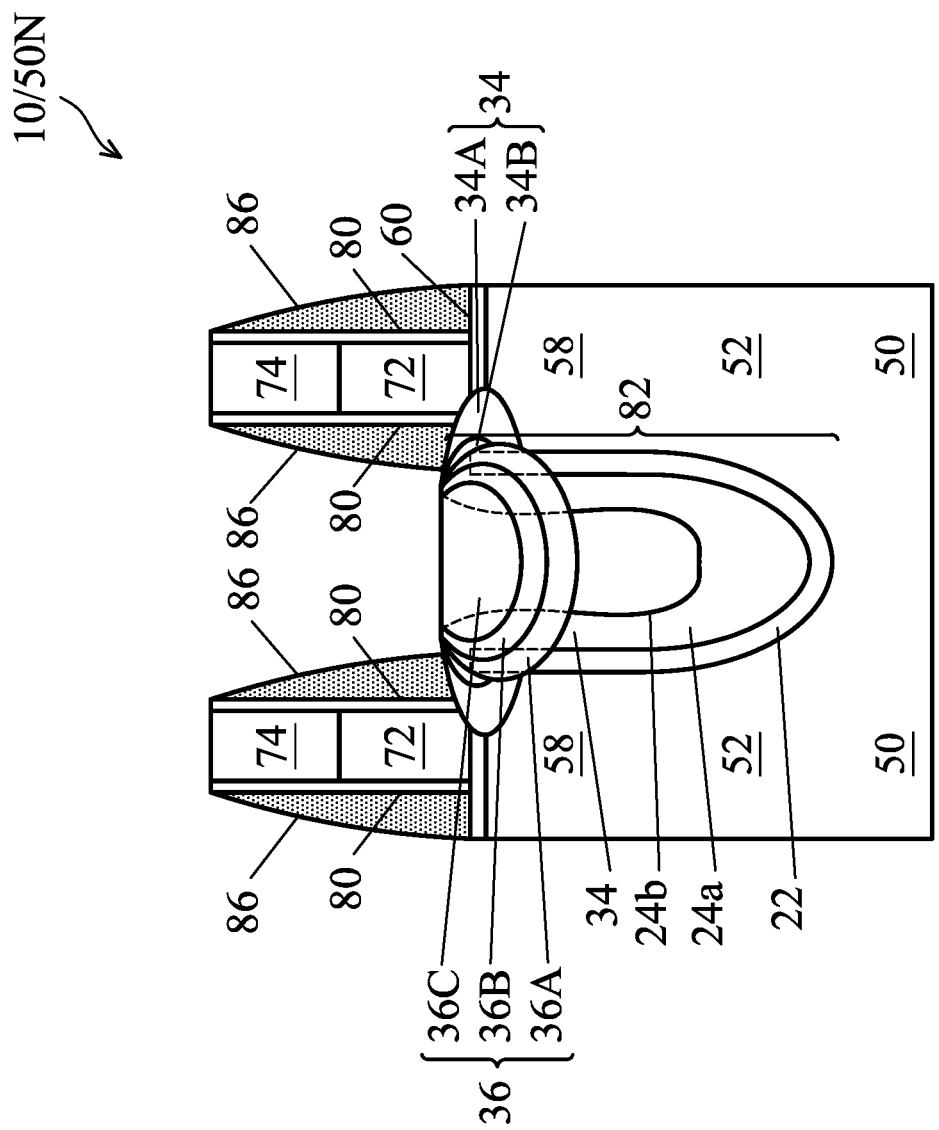
Figure 17:
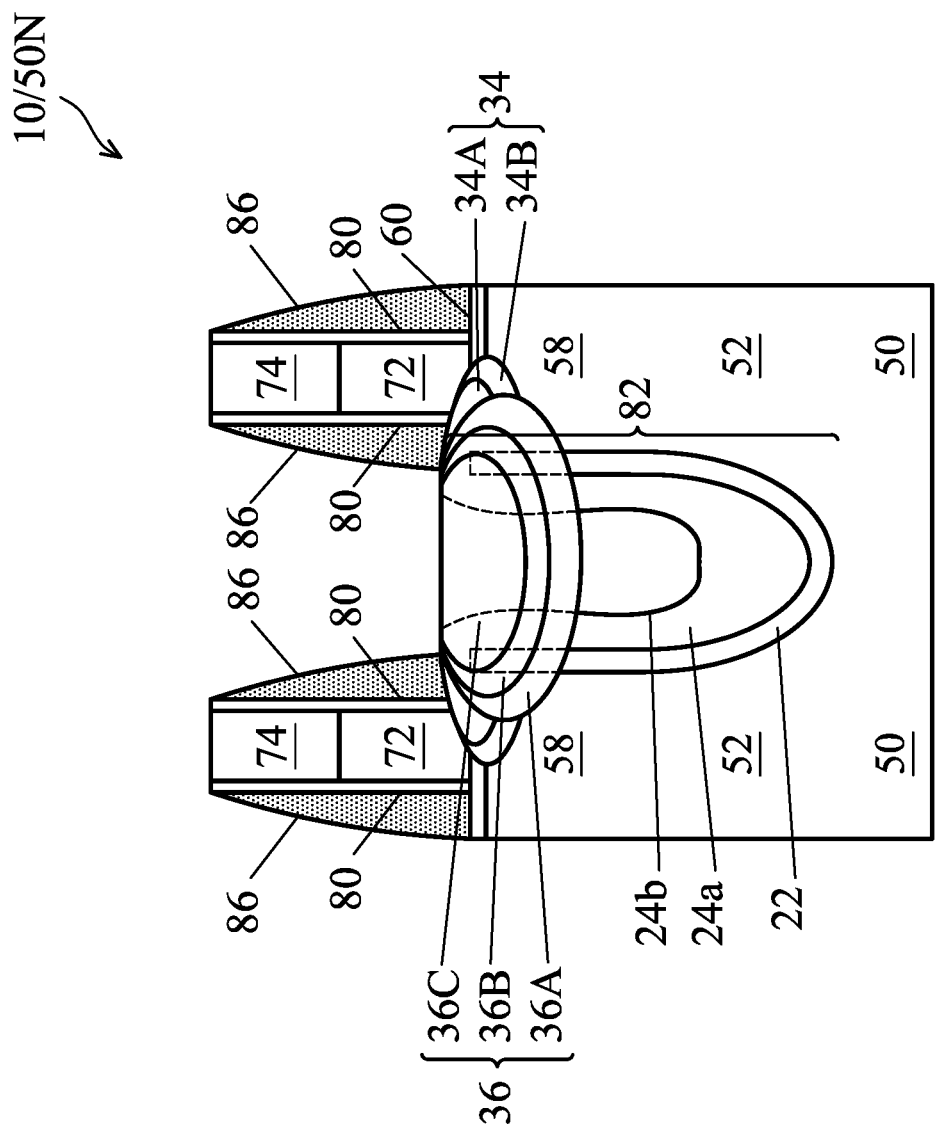

As explained above, a profile of the doped regions 34 and 36 may be adjusted by varying process parameters (e.g., rotation angle) of the implantation processes 26 and 30. FIG. 15A illustrates a profile that is achieved by not rotating the wafer 10 around the process chamber during the first implantation process 26 and the second implantation process 30. FIG. 16 illustrates an alternate embodiment where the wafer 10 is rotated 90° twice during each of the first implantation process 26 and the second implantation process 30. In FIG. 16, like reference numerals indicate like elements formed using like processes as FIG. 15A. As illustrated by FIG. 16, the doped regions 34 may be disposed on sides of the doped regions 36, and the doped regions 34 may further extend under the gate spacers 86/dummy gates 72. The doped regions 36 may extend further into the epitaxial source/drain regions 82 than the doped regions 34. FIG. 17 illustrates an alternate embodiment where the first implantation 26 includes rotating the wafer 10 by 90° four times, and the second implantation 30 does not include rotating the wafer 10. In FIG. 17, like reference numerals indicate like elements formed using like processes as FIG. 15A. As illustrated by FIG. 17, the doped regions 34 may be disposed on sides of the doped regions 36, and the doped regions 34 may further extend under the gate spacers 86/dummy gates 72. The doped regions 34 may likewise extend under the gate spacers 86/dummy gates 72, and the doped regions 36 may extend further into the epitaxial source/drain regions 82 than the doped regions 34. In each of the embodiments of FIGS. 16 and 17, the doped regions 34 includes regions 34A and 34B, and an impurities concentration of the third impurities in the region 34A may be greater than the region 34B. The impurities concentration in each of the regions 34A and/or 34B may be constant or varied. Other configurations of the doped regions 34 and 36 are also possible.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

Figure 18B:
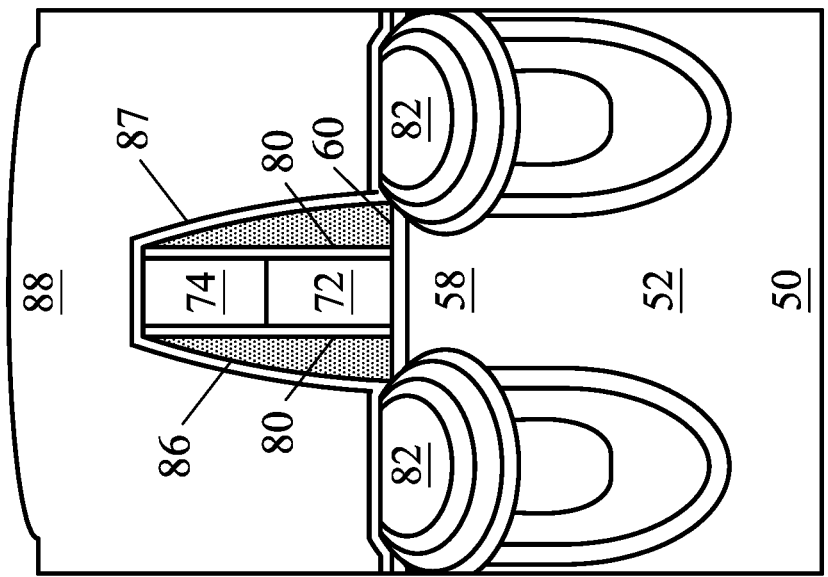
Figure 18A:
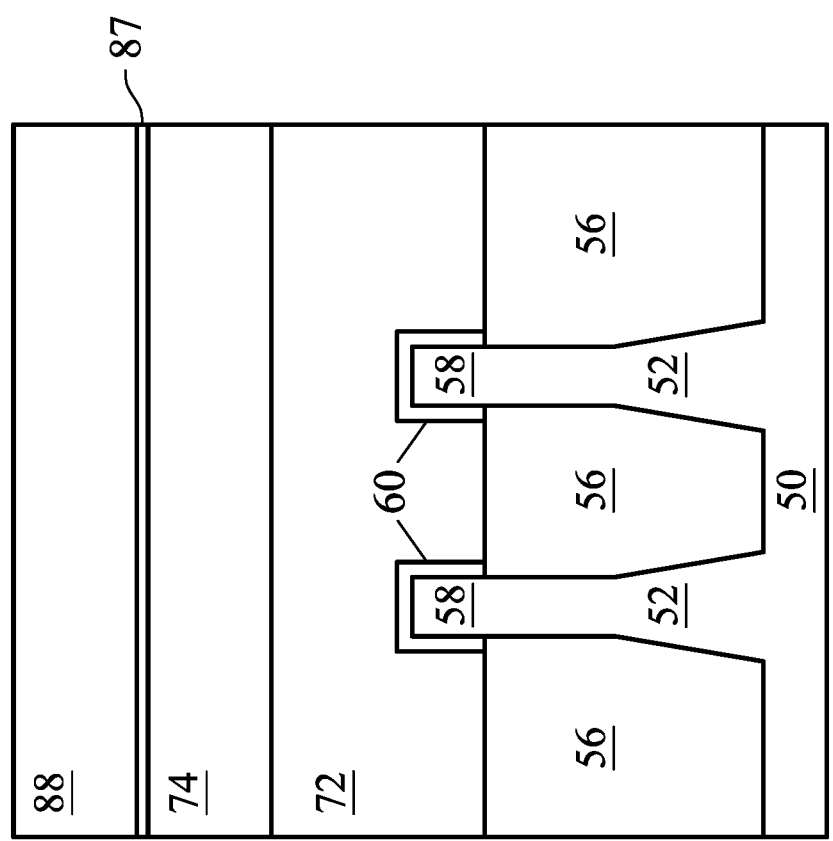

In FIGS. 18A and 18B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 19B:
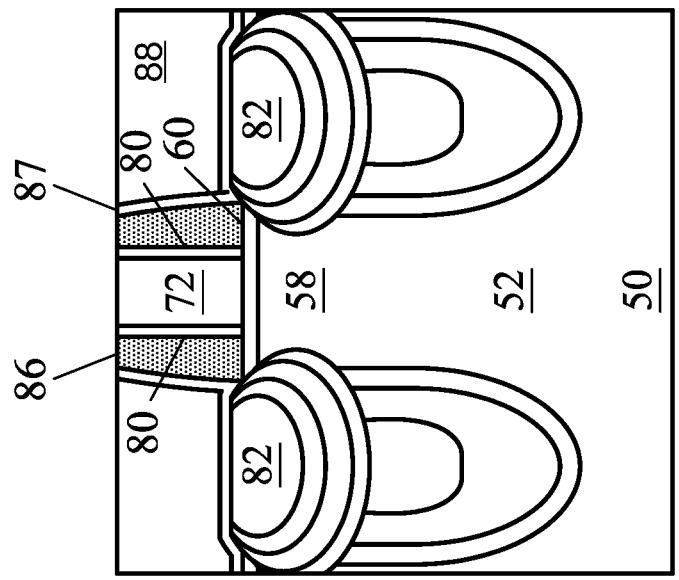
Figure 19A:
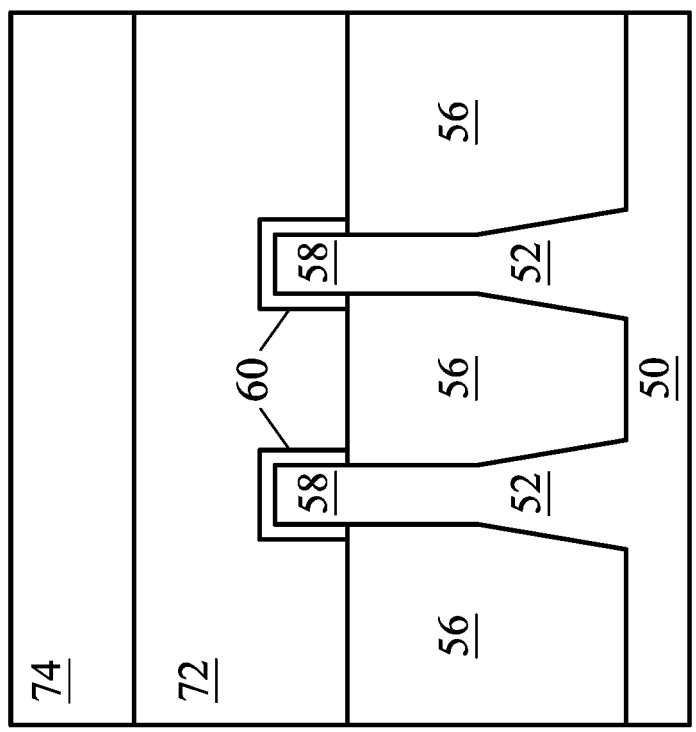

In FIGS. 19A and 19B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 20B:
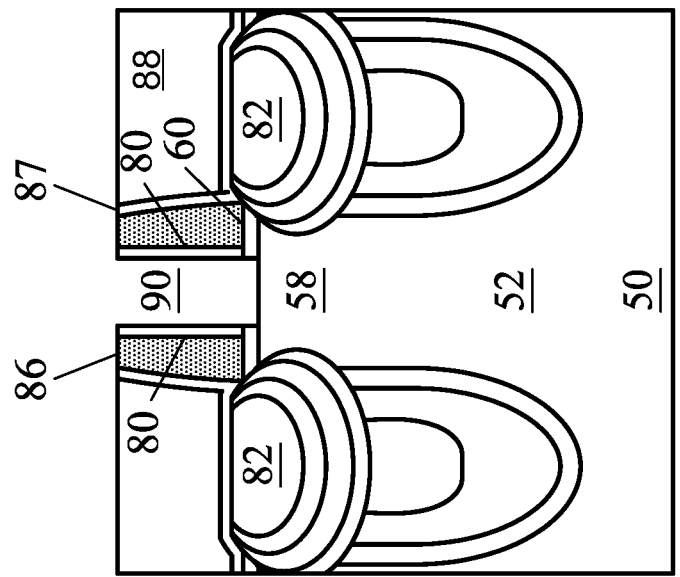
Figure 20A:
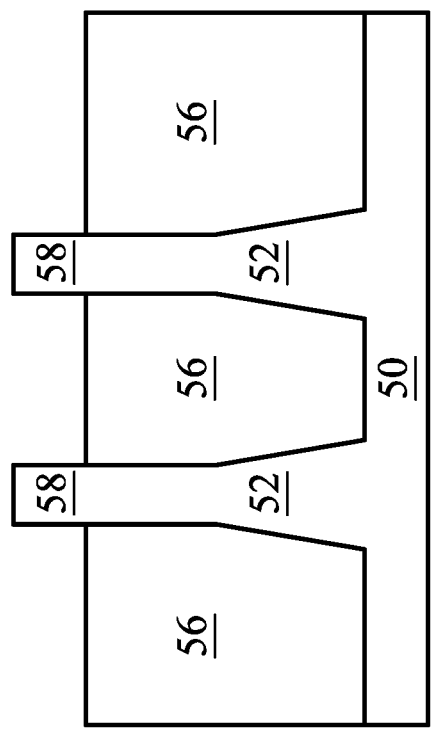

In FIGS. 20A and 20B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 21B:
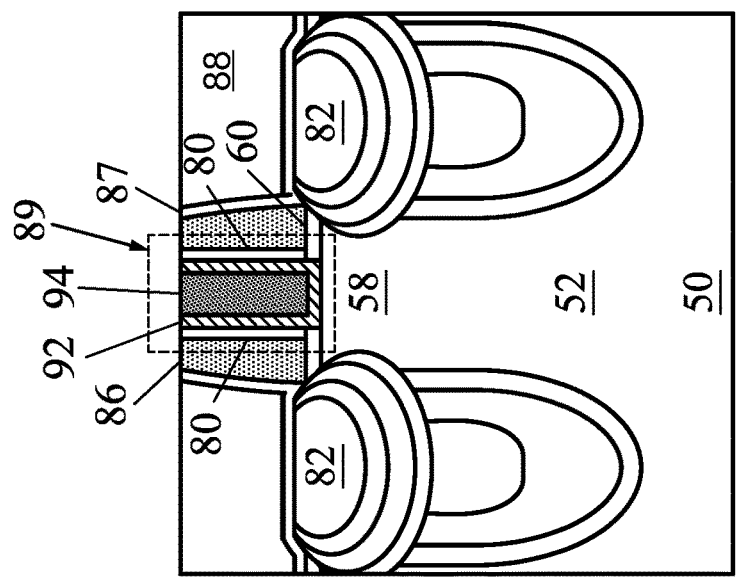
Figure 21A:
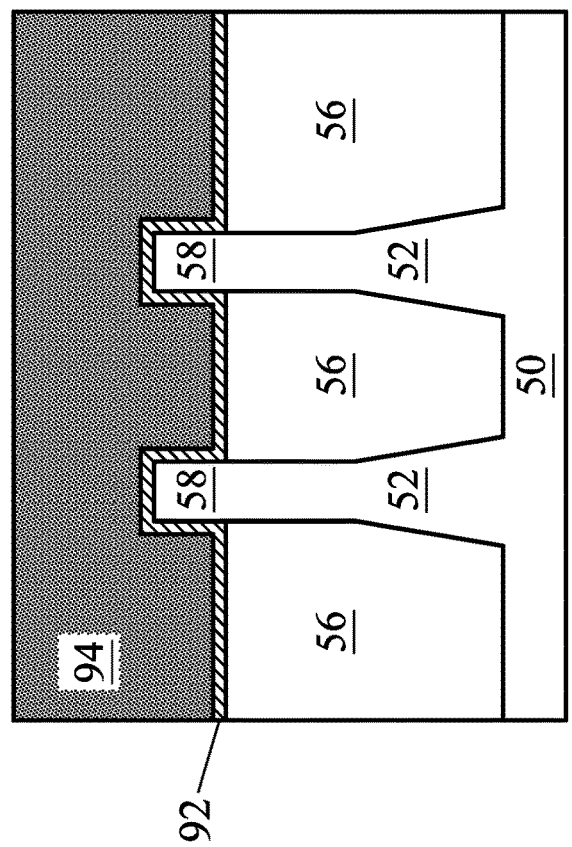
Figure 21C:
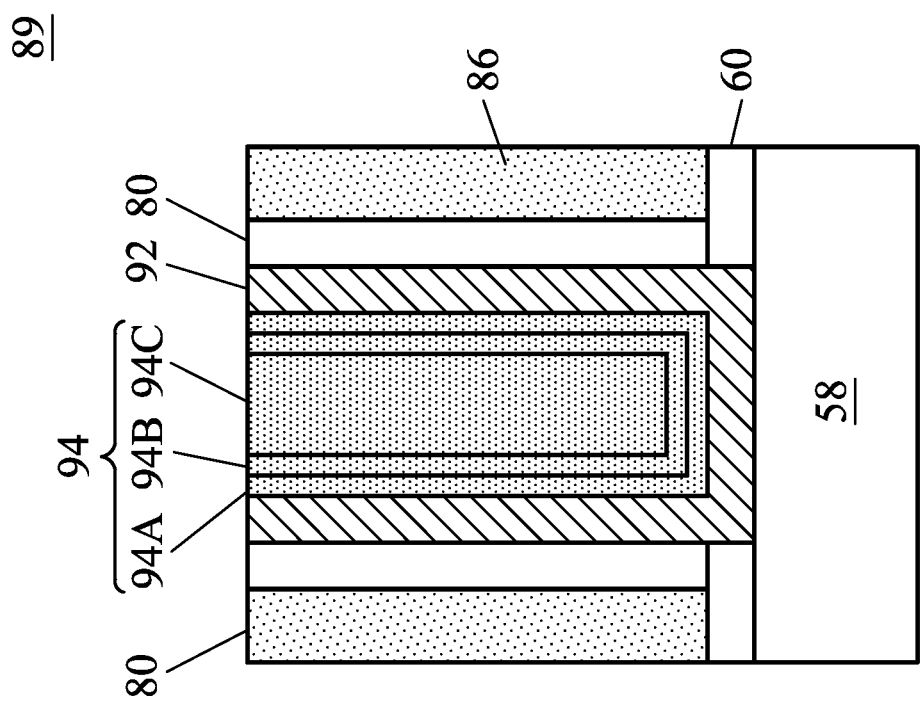

In FIGS. 21A and 21B, gate dielectric layers 92 and gate electrodes 94 are formed for replacement gates. FIG. 21C illustrates a detailed view of region 89 of FIG. 21B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 21B, the gate electrode 94 may comprise any number of liner layers 94A, any number of work function tuning layers 94B, and a fill material 94C as illustrated by FIG. 21C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 22B:
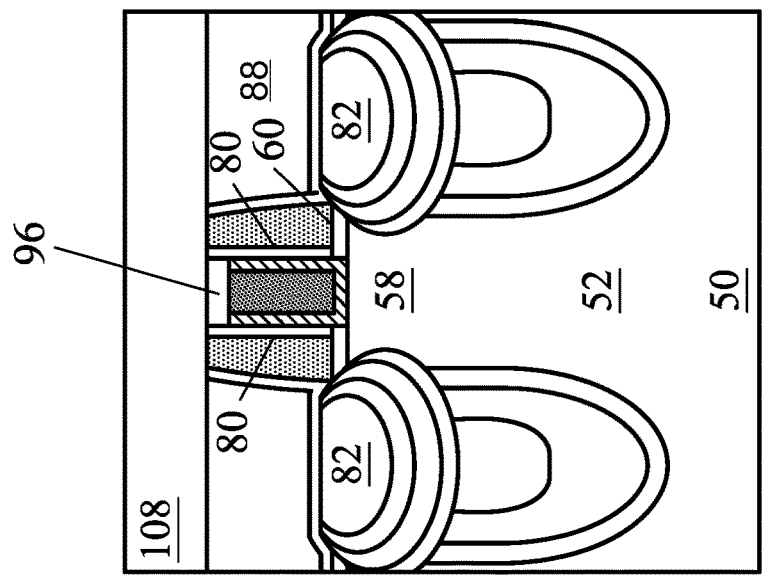
Figure 22A:
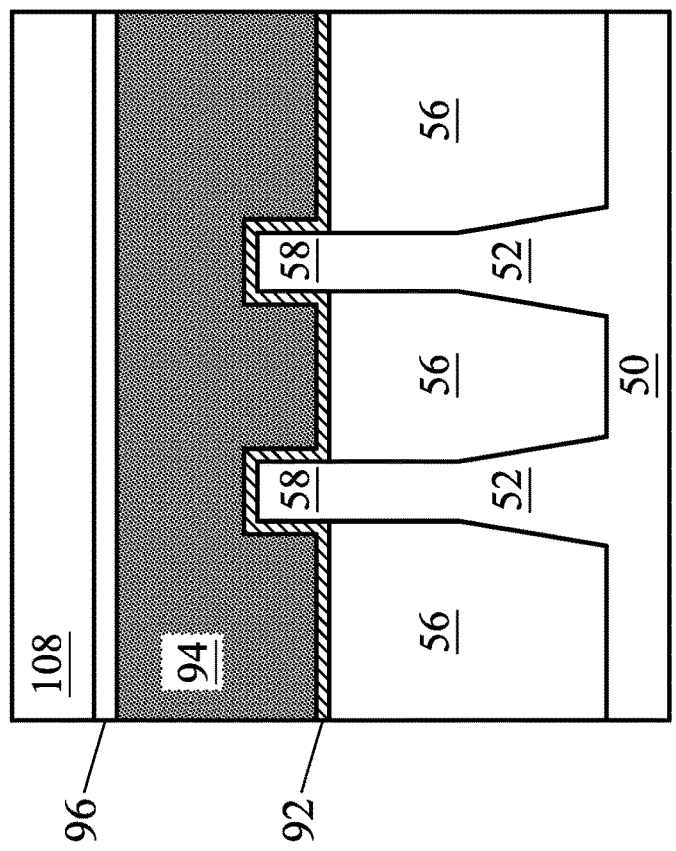

In FIGS. 22A and 22B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 22A and 22B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 to contact the top surface of the recessed gate electrode 94.

Figure 23B:
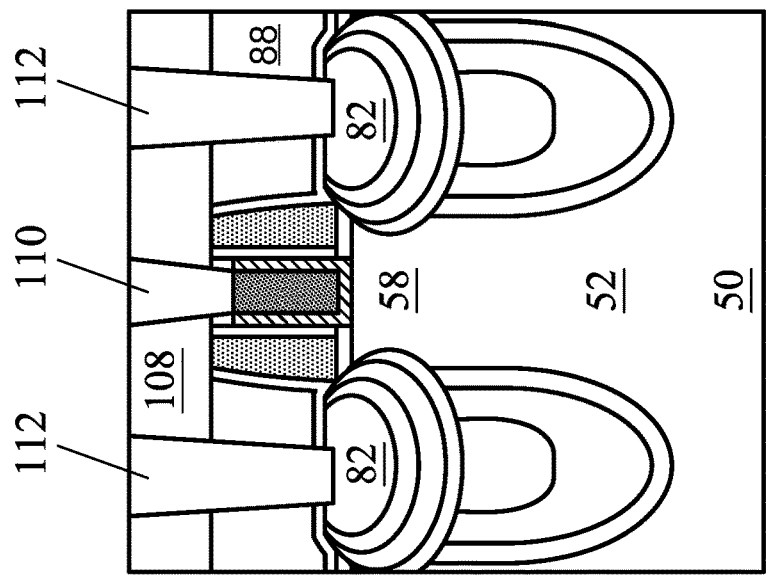
Figure 23A:
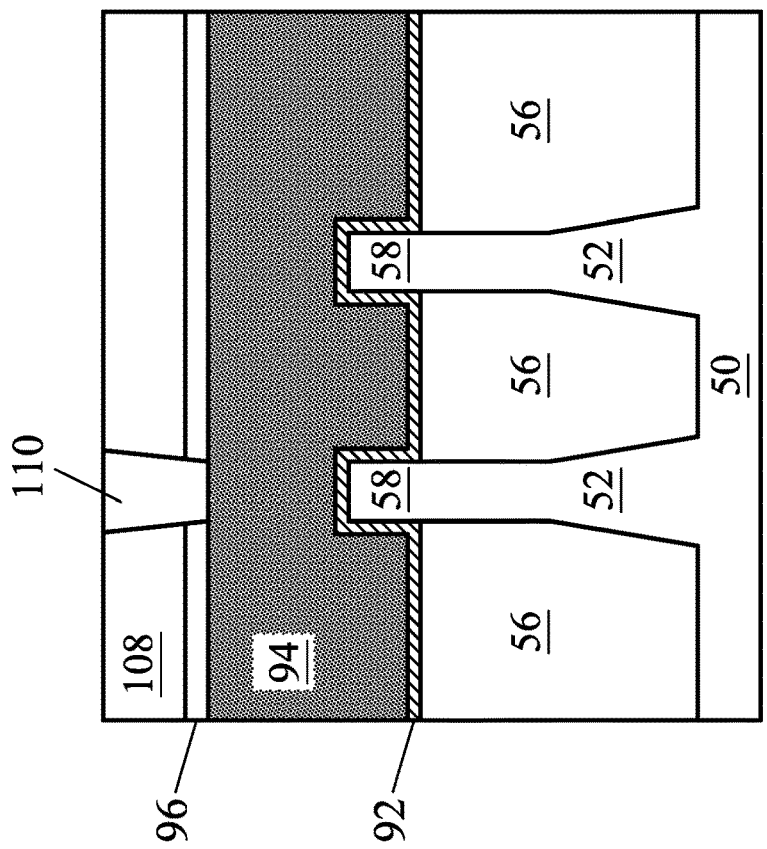

In FIGS. 23A and 23B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. As a result of the first implantation process 26 and the second implantation process 30, a concentration of the fourth impurities (e.g., phosphorous dimer, or the like) may be increased in an area where the source/drain contacts 112 connect to the epitaxial source/drain regions 82. As a result, a contact resistance of the source/drain contacts 112 can be advantageously reduced. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Various embodiments include implanting two different types of dopants into a source/drain region for improved junction abruptness (e.g., reduced leakage current) and reduced source/drain contact resistance. In an embodiment method, first dopants are implanted into a source/drain region followed by an implantation of second dopants. The first dopants may have a lower formation enthalpy than the second dopants. For example, the first dopants may comprise arsenic, carbon, antimony, or the like, and the second dopants may comprise phosphorous, or the like. In particular embodiments, the arsenic is implanted into the source/drain regions followed by a phosphorous dimer ($P_2$) implantation. As a result of its lower formation enthalpy, the first dopants are more attracted to and form more stable bonds with vacancies in the source/drain region. For example, the first dopants may be used to reduce diffusion of the second dopants and reduce the binding of the second dopants with the vacancies. By reducing diffusion of the second dopant, a higher concentration of the second dopant may be achieved in a contact area of the source/drain region, thereby reducing source/drain contact resistance. Further, the use of two different elements as dopants allows for a junction with improved abruptness and less diffusion, thereby providing improved short channel control (e.g., to counter the effects of drain-induced barrier lowering (DIBL) in advanced process nodes), reduced leakage, and improved device performance. Various embodiments may provide one or more of the following non-limiting advantages: improved junction abruptness, reduced diffusion of the second dopants, and reduced source/drain contact resistance.

In accordance with some embodiments, a method includes forming a source/drain region in a semiconductor fin; after forming the source/drain region, implanting first impurities into the source/drain region; after implanting the first impurities, implanting second impurities into the source/drain region, wherein the first impurities have a lower formation enthalpy than the second impurities; and after implanting the second impurities, annealing the source/drain region. In some embodiments, the first impurities comprise arsenic, antimony, or carbon. In some embodiments, the second impurities comprise phosphorous. In some embodiments, implanting the second impurities into the source/drain region comprises implanting phosphorous dimer into the source/drain region. In some embodiments, forming the source/drain region comprises: etching a recess in the semiconductor fin; epitaxially growing a first epitaxy region in the recess; in-situ doping the first epitaxy region with third impurities while epitaxially growing the first epitaxy region; epitaxially growing a second epitaxy region in the recess and over the first epitaxy region; and in-situ doping the second epitaxy region with fourth impurities while epitaxially growing the second epitaxy region, wherein the third impurities are a different element than the fourth impurities. In some embodiments, the third impurities are a same element as the first impurities. In some embodiments, annealing the source/drain region comprises: performing a microsecond anneal (OSA) on the source/drain region; and after performing the µSSA, performing a laser spike anneal (LSA) on the source/drain region.

In accordance with some embodiments, a method includes etching a recess in a semiconductor fin; epitaxially growing a source/drain region in the recess; after epitaxially growing the source/drain region, implanting the source/drain region with arsenic; after implanting the source/drain region with arsenic, implanting the source/drain region with phosphorous dimer; and after implanting the source/drain region with phosphorous dimer, activating the arsenic and the phosphorous dimer with an annealing process. In some embodiments, implanting the source/drain region with phosphorous dimer comprises using an implantation dose in a range of $10^{18}$ cm$^{-3}$ to $10^{22}$ cm$^{-3}$. In some embodiments, no annealing process is performed between implanting the source/drain region with arsenic and implanting the source/drain region with phosphorous dimer. In some embodiments, implanting the source/drain region with arsenic comprises rotating a wafer comprising the semiconductor fin by 90° twice. In some embodiments, implanting the source/drain region with arsenic comprises rotating a wafer comprising the semiconductor fin by 45° four times. In some embodiments, implanting the source/drain region with arsenic comprises not rotating a wafer comprising the semiconductor throughout an entire duration of implanting the source/drain region with arsenic.

In accordance with some embodiments, a device includes a semiconductor substrate; a gate stack at a top surface of the semiconductor substrate; a source/drain region adjacent the gate stack, wherein the source/drain region comprises a first epitaxy region comprising first impurities; a first doped region comprising second impurities in the first epitaxy region; and a second doped region comprising third impurities in the first epitaxy region, the second impurities having a lower formation enthalpy than the third impurities, the first doped region surrounding sides of the second doped region. In some embodiments, the source/drain region further comprises a second epitaxy region surrounding the first epitaxy region, wherein the second epitaxy region comprises fourth impurities, and the fourth impurities are a different element than the first impurities. In some embodiments, the second doped region extends lower than the first doped region. In some embodiments, the first doped region covers a bottom of the second doped region. In some embodiments, the second impurities are arsenic, and the third impurities comprise phosphorous. In some embodiments, a concentration of the third impurities increases in a direction towards a top surface of the source/drain region. In some embodiments, the device further comprises a source/drain contact extending into the second doped region, wherein a concentration of the third impurities at the source/drain contact is at least $10^{23}$ cm$^{-3}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a source/drain region in a semiconductor fin, wherein forming the source/drain region comprises:
   etching a recess in the semiconductor fin;
   epitaxially growing a first epitaxy region in the recess;
   in-situ doping the first epitaxy region with first impurities while epitaxially growing the first epitaxy region;
   epitaxially growing a second epitaxy region in the recess and over the first epitaxy region; and
   in-situ doping the second epitaxy region with second impurities while epitaxially growing the second epitaxy region, wherein the first impurities are a different element than the second impurities;
   after forming the source/drain region, implanting third impurities into the source/drain region;
   after implanting the first impurities, implanting fourth impurities into the source/drain region, wherein the third impurities have a lower formation enthalpy than the fourth impurities; and after implanting the fourth impurities, annealing the source/drain region to define:
a first doped region doped with the third impurities; and
a second doped region doped with the fourth impurities, the third impurities of the first doped region extending along sides and below the fourth impurities of the second doped region.

2. The method of claim 1, wherein the third impurities comprise arsenic, antimony, or carbon.

3. The method of claim 1, wherein the fourth impurities comprise phosphorous.

4. The method of claim 3, wherein implanting the fourth impurities into the source/drain region comprises implanting phosphorous dimer into the source/drain region.

5. The method of claim 1, wherein the third impurities are a same element as the first impurities.

6. The method of claim 1, wherein annealing the source/drain region comprises:
performing a microsecond anneal (μSSA) on the source/drain region; and
after performing the μSSA, performing a laser spike anneal (LSA) on the source/drain region.

7. A method comprising:
etching a recess in a semiconductor fin;
epitaxially growing a source/drain region in the recess;
after epitaxially growing the source/drain region, implanting the source/drain region with arsenic;
after implanting the source/drain region with arsenic, implanting the source/drain region with phosphorous dimer; and
after implanting the source/drain region with phosphorous dimer, activating the arsenic and the phosphorous dimer with an annealing process that causes the arsenic and the phosphorous dimer to spread laterally under a gate spacer, wherein activating the arsenic and the phosphorous dimer further defines:
an arsenic doped region; and
a phosphorous doped region, arsenic of the arsenic doped region extending along sides and below the phosphorous doped region.

8. The method of claim 7, wherein implanting the source/drain region with phosphorous dimer comprises using an implantation dose in a range of $10^{18}$ cm$^{-3}$ to $10^{22}$ cm$^{-3}$.

9. The method of claim 7, wherein no annealing process is performed between implanting the source/drain region with arsenic and implanting the source/drain region with phosphorous dimer.

10. The method of claim 7, wherein implanting the source/drain region with arsenic comprises rotating a wafer comprising the semiconductor fin by 90° twice.

11. The method of claim 7, wherein implanting the source/drain region with arsenic comprises rotating a wafer comprising the semiconductor fin by 45° four times.

12. The method of claim 7, wherein implanting the source/drain region with arsenic comprises not rotating a wafer comprising the semiconductor fin throughout an entire duration of implanting the source/drain region with arsenic.

13. A method comprising:
forming a gate stack at a top surface of a semiconductor substrate;
etching an opening adjacent to the gate stack;
forming a source/drain region in the opening, wherein the source/drain region comprises a first epitaxy region comprising first impurities;
implanting second impurities in the first epitaxy region;
implanting third impurities in the first epitaxy region, the second impurities having a lower formation enthalpy than the third impurities;
performing an annealing process after implanting the third impurities in the first epitaxy region, wherein after the annealing process, a first doped region and a second doped region are defined, the first doped region being doped with the second impurities, the second doped region doped with the third impurities, the first doped region surrounding sides of the second doped region such that the second impurities of the first doped region extend along sides of the third impurities of the second doped region and below the third impurities of the second doped region; and
forming a source/drain contact extending into the second doped region, wherein a concentration of the third impurities at the source/drain contact is at least $10^{23}$ cm$^{-3}$.

14. The method of claim 13, wherein the source/drain region further comprises a second epitaxy region surrounding the first epitaxy region, wherein the second epitaxy region comprises fourth impurities, and the fourth impurities are a different element than the first impurities.

15. The method of claim 13, wherein the second impurities are arsenic, antimony, or carbon.

16. The method of claim 15, wherein the third impurities are phosphorous.

17. The method of claim 13, wherein a concentration of the third impurities increases in a direction towards a top surface of the source/drain region.

18. The method of claim 13, wherein after the annealing process, the second impurities of the first doped region extend directly under a gate spacer, the gate spacer extending along a sidewall of the gate stack.

* * * * *